United States Patent [19]

Yoshino et al.

[11] Patent Number: 4,670,979

[45] Date of Patent: Jun. 9, 1987

[54] METHOD OF AND APPARATUS FOR MOUNTING AN ELECTRONIC PART

[75] Inventors: Shigeru Yoshino; Junzo Ueki; Ichiro Shibuya; Shigeo Kawada; Akira Iino; Hiromasa Tanzaki; Kazuo Murano, all of Kodaira, Japan

[73] Assignee: Silver Seiko Ltd., Tokyo, Japan

[21] Appl. No.: 732,308

[22] Filed: May 9, 1985

[30] Foreign Application Priority Data

May 9, 1984 [JP] Japan .................... 59-91012

[51] Int. Cl.⁴ .................... H05K 3/30; B23P 19/00
[52] U.S. Cl. .................... 29/838; 29/741; 140/147
[58] Field of Search ........... 140/147; 29/741, 837, 29/838, 842, 844, 845, 839; 174/68.5

[56] References Cited

U.S. PATENT DOCUMENTS

| 2,754,486 | 7/1956 | Hathorn | 29/839 X |
| 3,075,562 | 1/1963 | Jankowski | 140/147 |
| 3,162,721 | 12/1964 | Rayburn | 174/68.5 |
| 3,219,068 | 11/1965 | Strohl | 140/147 |
| 3,447,224 | 6/1969 | Helda | 140/147 |
| 3,520,336 | 7/1970 | Zemek | 140/147 |
| 3,525,372 | 8/1970 | Haven | 140/147 |
| 3,570,559 | 3/1971 | Palmer | 140/147 |
| 3,722,179 | 2/1964 | Zimmerman et al. | 140/147 |
| 3,880,205 | 4/1975 | Linker et al. | 140/147 |
| 4,221,244 | 9/1980 | Weresch | 140/105 |

FOREIGN PATENT DOCUMENTS 80512 6/1983 European Pat. Off. .

Primary Examiner—Howard N. Goldberg
Assistant Examiner—Carl J. Arbes
Attorney, Agent, or Firm—Cushman, Darby & Cushman

[57] ABSTRACT

A simplified method of and apparatus for mounting an electronic part such as a transistor on a circuit board. Two or more selected ones of terminals of an electronic part are angularly bent in prior, and when the electronic part is to be mounted on a circuit board, the terminals are forcibly inserted into through-holes of the circuit board to an extent wherein bent portions of the terminals are projected below the circuit board. As a result, if a weak force is applied to pull the part off, the bent portions of the terminals will frictionally engage with edges of the through-holes to prevent the part from being removed from the board.

11 Claims, 21 Drawing Figures

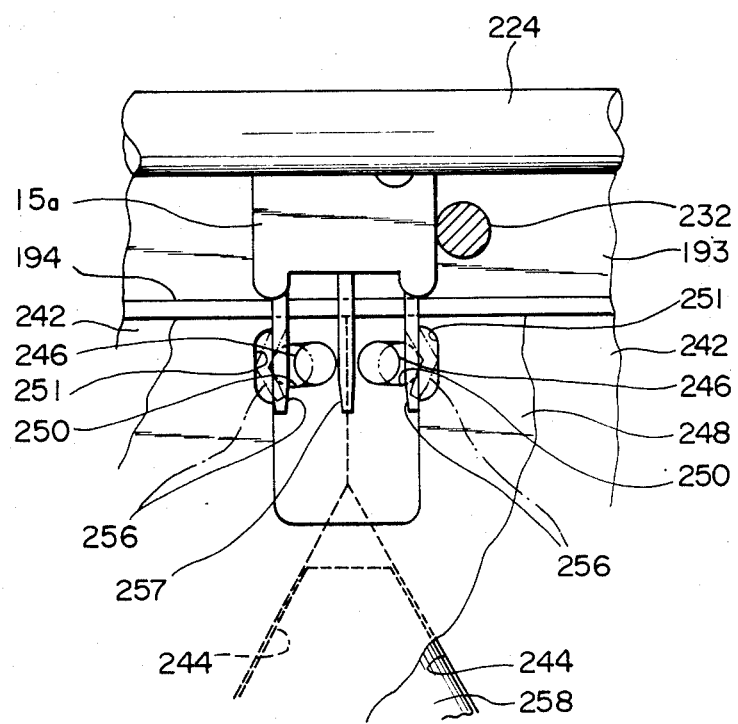

METHOD OF AND APPARATUS FOR MOUNTING AN ELECTRONIC PART

BACKGROUND OF THE INVENTION

This invention relates to a method of and an apparatus for inserting terminals of an electronic part such as a transistor or an IC (integrated circuit) chip into through-holes of a printed circuit board or the like to mount the former on the latter.

One of conventional methods of mounting an electronic part is attained by the use of an automatic mounting apparatus which is disclosed, for example, in European Patent Publication No. 080512, and Japanese laid-open patent No. 57-199296.

In the automatic mounting apparatus, a so-called irregularly shaped electronic part such as a transistor or an IC chip, which is normally included in a relatively small number in a circuit board than other regularly shaped electronic parts, is grasped by a mounting head of a mechanical hand which can move in horizontal back and forth, and leftward and rightward directions, and vertical upward and downward directions. The electronic part is then mounted, by the mounting head, on a printed circuit board with straight terminals thereof inserted into through-holes of the circuit board from above. At least lower portions of two of the terminals of the electronic part which extend downwardly below the printed circuit board are bent by means of a clinch pawl provided on an anvil head to mount the electronic part so as not to be let off te circuit board.

Such a conventional method and apparatus as described above has a defect that the mounting speed is lowered for a time required to bend lower portions of the terminals of an electronic part by a clinch pawl.

It is another defect of the conventional method and apparatus that it is difficult to attain appropriate harmonization at a high speed between an operation for inserting terminals of an electronic part into through-holes of a printed circuit board by means of a mechanical hand and another operation for bending lower portions of the terminals by means of a clinch pawl of an anvil head, resulting in an obstacle to raise the speed of a mounting operation, and provision of such an anvil makes the entire apparatus expensive.

SUMMARY OF THE INVENTION

It is an object of the present invention to provide an electronic part mounting method and apparatus which omits a step of bending lower portions of the terminals of an electronic part by means of a clinch pawl as described above to eliminate such defects of conventional methods and apparatus as described above.

According to the present invention, at least two of the terminals of an electronic part such as transistor or an IC chip or device which is to be mounted on a printed circuit board are bent in prior to such a predetermined angle as will prevent the terminals of the electronic part, when mounted on a printed circuit board, from being let off through holes of a printed circuit board. Then, the terminals of the electronic part are inserted into through-holes of a printed circuit board to an extent that the bent portions of the terminal of the electronic part extend downwardly below the printed circuit board to thus mount the electronic part so as not to be let off or unintentionally disengaged from the printed circuit board. Since the terminals are suitably bent in prior at intermediate portions thereof, when they are put into the through-holes, they will engage with and be yieldably deflected by the edges of the through-holes, but on the other hand when they are in their fully inserted positions, a slight pull to the electronic part will not be sufficient to remove it since the bent portions of the terminals frictionally engage with the edges of the through-holes. Accordingly, the present invention eliminates the need for a separate terminal clinching mechanism and the separate terminal clinching step to thus allow increased operating speeds at reduced costs.

BRIEF DESCRIPTION OF THE DRAWINGS

FIG. 21 is an enlarged side elevational view illustrating terminals of an electronic part to be bent.

DETAILED DESCRIPTION OF THE INVENTION

Figure 1:
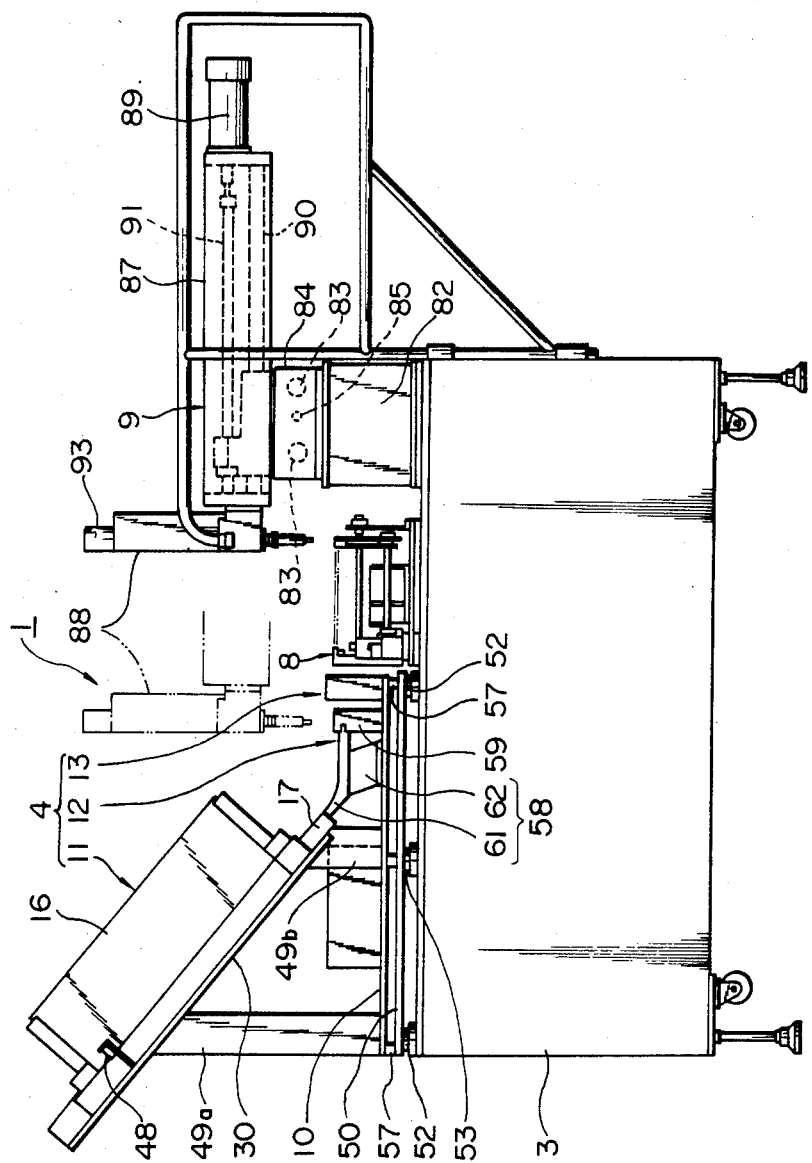
FIG. 1 is a front elevational view of an electronic part mounting apparatus according to the prevent invention.
Figure 2:
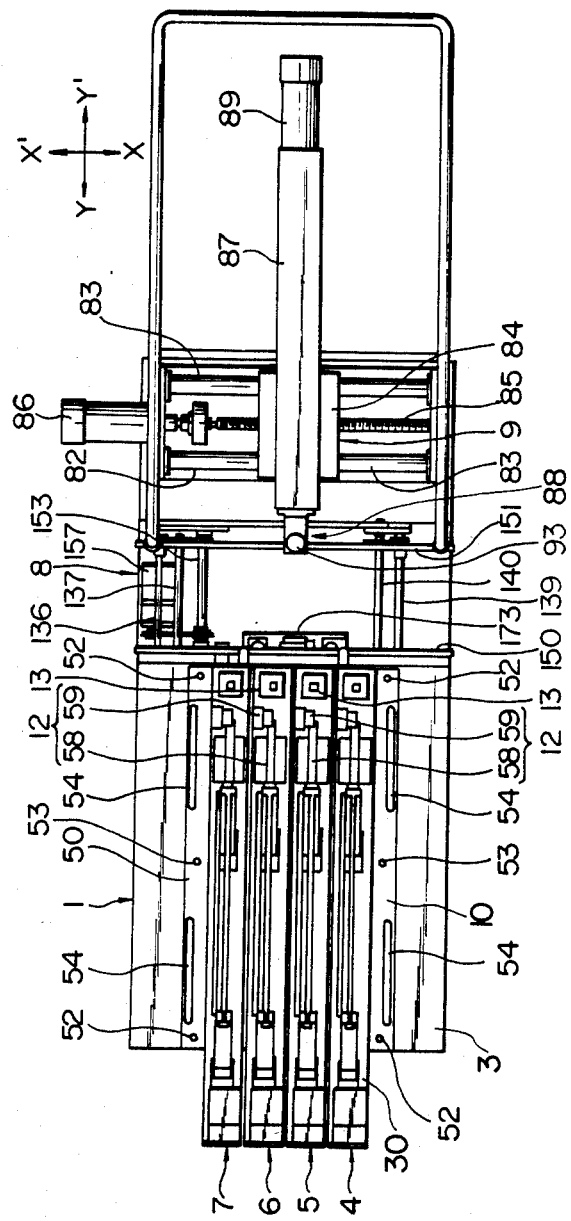
FIG. 2 is a plan view of the apparatus of FIG. 1.

Description will be first given below of an electronic part mounting apparatus 1 according to the present invention. Referring first to FIG. 1 and 2, the electronic part mounting apparatus 1 includes part feeding units 4, 5, 6 and 7 located adjacent one another (FIG. 2) in a row on a left-hand side half of an upper face of a machine bed 3 in the form of a parallelepiped, an inserting device 9 located on a right-hand side half of the machine bed 3, and a circuit board feeding mechanism 8 located between the feeding units 4, 5, 6, and 7 and the inserting device 9. As explained more fully below, electronic parts having pre-bent terminals are supplied by the feeding units 4, 5, 6, and 7, grasped by a mechanical hand of the inserting devie 9, and inserted in the appropriate position in a printed circuit board carried by the circuit board feeding mechanism 8.

The part feeding units 4 to 7 each include a part supply mechanism 11, a delivering and transporting mechanism 12, and a hand storing mechanism 13 arranged in a serial row on an elongated support plate 10.

The part supply mechanism 11 includes a magazine case 16 in which a certain number of magazines 14, in which electronic parts (transistors in this case) 15 are stored, are received such that the electronic parts 15 may be supplied one by one by way of a delivery guide member 17.

Figure 15:
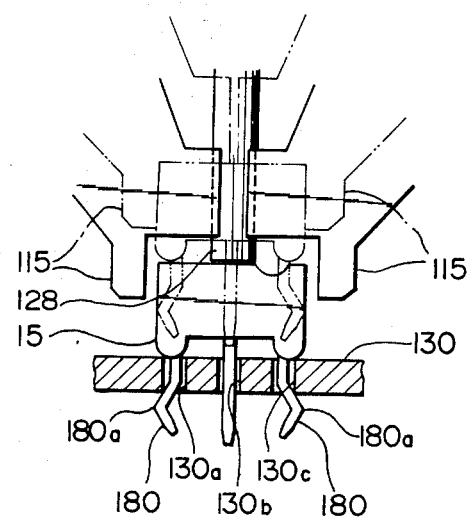
FIG. 15 is a side elevational view illustrating an electronic part mounted on a printed circuit board.

Each electronic part 15 is in the form of a flattened parallelepiped package, typically plastic having up to three terminals arranged in a row thereon with the two opposite side terminals being angularly bent in previously by means of an electronic part terminal bending device 2 which will be hereinafter described in detail in relation to FIGS. 16–21. The configuration or shape of the bent terminals can be seen in FIG. 15 and, as shown, opposite side terminals 180 each include angularly bent portions 180a which prevent the inserted electronic part from being inadvertently disengaged from or let off the printed circuit board 130.

Each magazine 14 is in the form of an elongated square tube in which a number of electronic parts 15 are stored in a serial row for individual sliding movement with their terminals directed downwardly.

The magazine case 16 of the embodiment is designed to receive therein up to 12 such magazines 14, one on top of another, and is in the form of a framework or box which is a little longer than the magazines 14 and is rectangular as viewed from its side with top and bottom sides and one of its lateral sides opened. A pair of guide bars 18a and 18b (FIG. 3) extend vertically along and are mounted at portions adjacent inner edges of left and right inward extensions 16a of the magazine case 16 which are bent into L-shapes in plan, and another pair of guide bars 18c and 18d having a similar configuration are located in opposition to the guide bars 18a and 18b, respectively.

Figure 3:
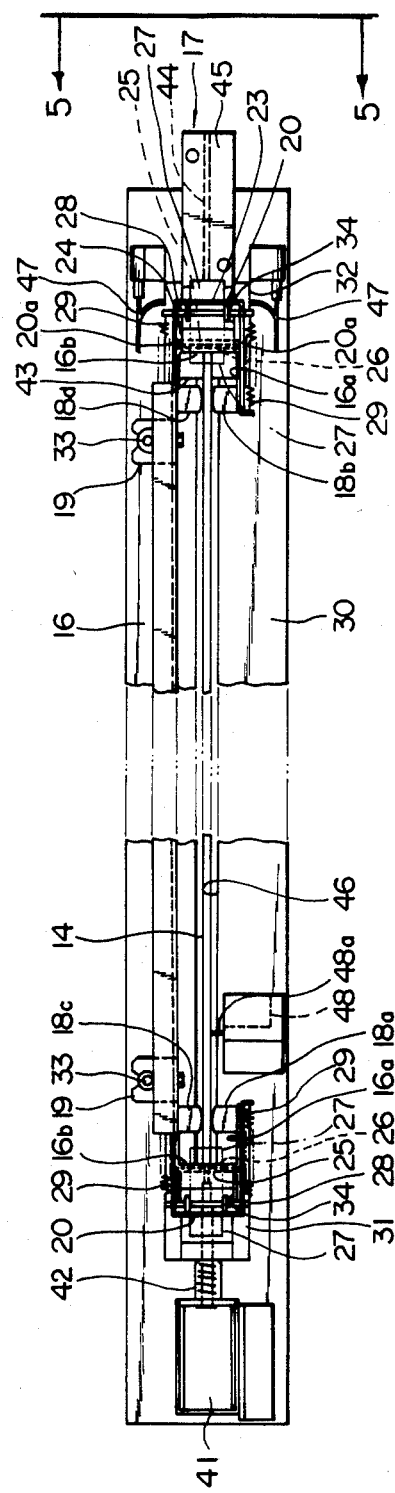
FIG. 3 is an enlarged top view, partly cut away, illustrating a magazine case of the apparatus of FIG. 1.
Figure 4:
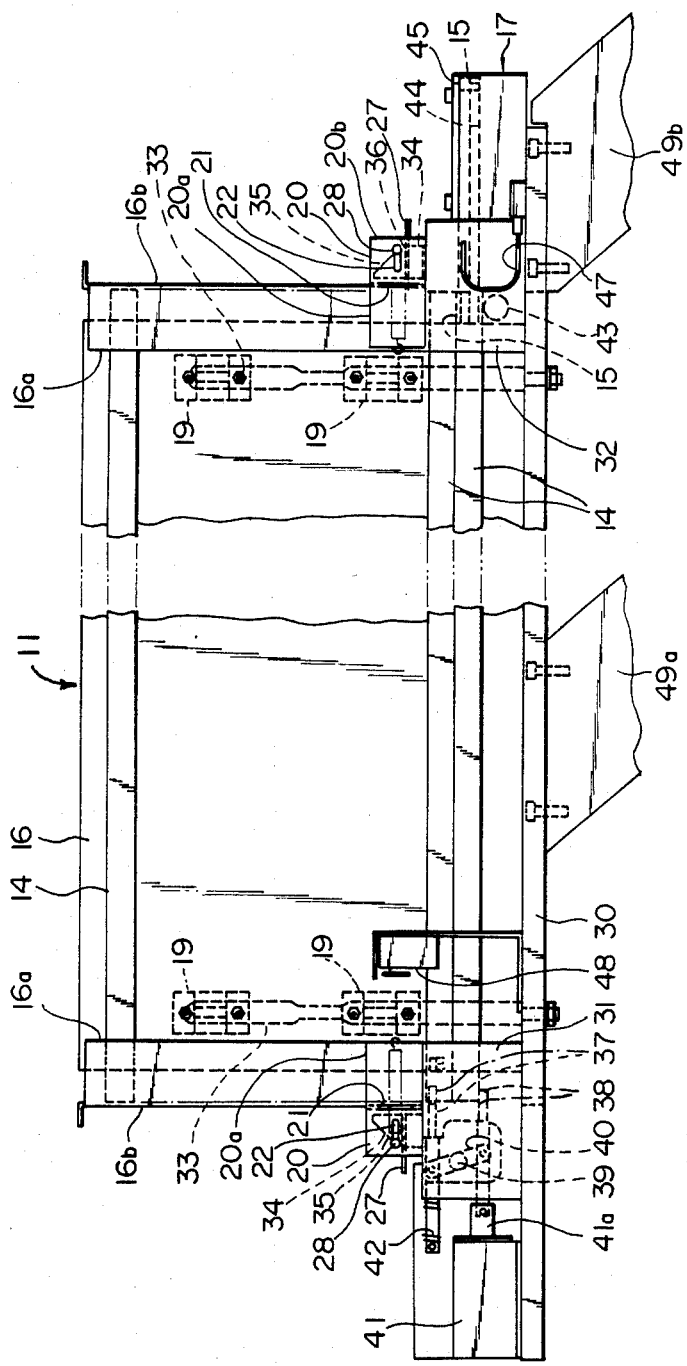
FIG. 4 is a front elevational view, partly cut away, of the magazine case of FIG. 3.
Figure 5:
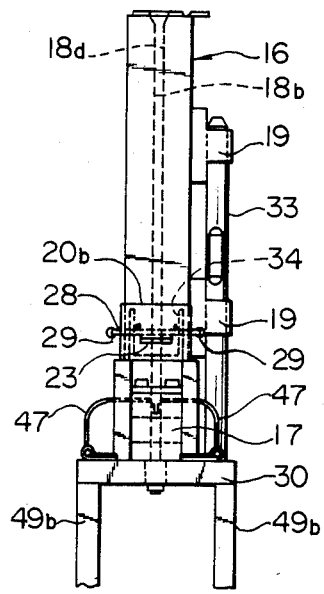
FIG. 5 is a side elevational view of the magazine case of FIG. 3.

The guide bars 18a to 18d have their opposing side faces curved arcuately, and opposite ends of the magazines 14 are fitted for sliding movement between the guide bars 18a and 18c and between the guide bars 18b and 18d. Opposite longitudinal ends of the magazine case 16 are closed by a pair of left and right bent end walls 16b of the magazine case 16 so as to prevent electronic parts 15 from being let off the magazines 14 (FIGS. 3 and 4).

A pair of upper and lower bearing members 19 are screwed to opposite left and right end portions of an outer side of the magazine case 16 and each have a bearing recess formed therein which has a substantially U-shape in plan with an inside thereof developed into a partially cut circle.

A pair of support brackets 20 are mounted at opposite left and right ends of the magazine case 16 and are each formed from an elongated plate bent into a substantially U-shape in plan. A pair of vertical slits 21 and a pair of horizontal bearing holes 22 are formed in opposing portions of longer sides 20a while a horizontal slit 23 is formed in a shorter side 20b of each of the support brackets 20.

A support member 24 having a substantially same shape with the shorter side 20b is mounted in parallel opposing relationship to the shorter side 20b of each of the support brackets 20 by means of a pair of projections formed at opposite ends thereof and received in the slits 21 of the longer sides 20a of the support bracket 20. A slit 25 having the same configuration is formed at a portion of the support member 24 opposing to the slit 23 of the support bracket 20.

The support brackets 20 are mounted such that left and right lower end portions of the magazine case 16 are grasped by the longer sides 20a of the support brackets 20 and the support members 24 are contacted with opposing faces of the bent walls 16b of the magazine case 16.

The magazine case 16 have formed at portions of the end walls 16b thereof opposing to the slits 25 of the support members 24 a pair of slits 26 having the same configuration with the slits 25.

An abutment member 27 in the form of a rectangular plate is mounted on each of the support brackets 20 and has a support shaft 28 pivotally supported by bearing portions formed at central portions of longer edges of the abutment member 27. Opposite end of the support shaft 28 are received for sliding movement in the bearing holes 22 of the support bracket 20. An end portion of the abutment member 27 is fitted for sliding movement in the slit 23 of the support bracket 20 while the other end portion is fitted for sliding movement in the slits 25 and 26 of the supporting member 24 and the end wall 16b of the magazine case 16, respectively.

The abutment member 27 is urged by a pair of tension springs 29 extending between opposite ends of the support shaft 28 and the support bracket 20 to an abutting position (phantom in FIG. 3) in which the other end portion thereof extends into the magazine case 16 through the slit 26 of the end wall 16b of the magazine case 16. Thus, opposite end portions of the lowermost one of the magazines 14 received in the magazine case 16 are supported on the opposite end portions of the abutment members 27 in the abutting positions.

The magazine case 16 is supported on a case supporting plate 30, and a pair of mounting brackets 31 and 32 having a substantially H-shape in plan are secured to left and right end portions of an upper face of the case supporting plate 30. A pair of support rods 33 for supporting the magazine case 16 thereon are erected at portions of the case supporting plate 30 just inside of the mounting brackets 31 and 32.

A pair of abutting pawl members 34 are screwed to central portions of upper faces of the mounting brackets 31 and 32 and each have an inclined cam 35 and an abutting shoulder 36 formed at an upper side thereof.

A pair of abutting rods 37 and 38 (FIG. 4) for supporting a magazine 14 thereon are mounted for alternative movement between an abutting position and a nonabutting position at a left side portion of the mounting bracket 31 (FIG. 3).

In particular, a link 40 is supported for rotation on a shaft 39 mounted horizontally on the mounting bracket 31, and a central portion of the abutting rod 37 is pivotally mounted at an upper end of the link 40 while a central portion of the abutting rod 38 is pivotally mounted at a lower end of the link 40. A left end of the abutting rod 38 is supported for pivotal motion on a plunger 41a of a solenoid 41 located at a left end portion of the case supporting plate 30. The link 40 is urged by a spring 42 to a position in which the abutting rod 38 is held to the abutting position (a broken line position in FIG. 4) while the abutting rod 37 is held to the non-abutting position (phantom in FIG. 4).

As the solenoid 41 is energized so that the abutting rod 38 is drawn and displaced leftwardly (in FIGS. 3 and 4) by the plunger 41a to the non-abutting position (phantom in FIG. 4), the link 40 is pivoted clock-wise thereby to displace the abutting rod 37 to its abutting position (phantom in FIG. 4).

On the contrary, as the solenoid 41 is deenergized to allow the plunger 41a to be returned to its initial position, the link 40 is pivoted counterclockwise under the control of the spring 42 to allow the abutting rod 38 to returns to its abutting position while the abutting rod 37 returns to its non-abutting position.

A support rod 43 having a circular cross section for supporting a magazine 14 thereon is horizontally mounted on a left side portion of the mounting bracket 32 (FIGS. 3 and 4), and the delivering guide member 17 is located on an upper face of the case supporting plate 30 rightwardly of the supporting rod 43.

The delivering guide member 17 is in the form of a parallelepiped which is elongated in plan, and a guide groove 44 adapted to receive electronic parts 15 for sliding movement therein is formed to extend in the longitudinal direction along an upper face of the delivering guide member 17. A left end of the delivering guide member 17 is located near the support rod 43 while a right end thereof extends rightwardly outwardly of the case supporting plate 30. A cover 45 is mounted on the top of the delivering guide member 17.

An elongated opening 46 for letting a magazine 14 drop is formed in and extends between portions of the case supporting plate 30 below the support rod 43 and the abutting rod 38.

A pair of photosensors 47 are mounted on the case supporting plate 30 and have their ends disposed in opposing relationship at an intermediate position of the guide groove 44 so that they may detect presence of an electronic part 15 in the guide groove 44.

A limit switch 48 is located on the case supporting plate 30 and has an actuator 48a adapted and so located to engage with a lowermost one of magazines 14 in the magazine case 16 in order to detect presence of a magazine 14.

Four pairs of long and short support legs 49a and 49b are mounted on a lower face of the case supporting plate 30 and each have lower ends thereof mounted on each of the supporting plates 10 provided in a row on a platform 50 located on the machine bed 3. Thus, the support legs 49a and 49b in each pair support thereon a case supporting plate 30 in an inclined position at a predetermined slope (FIG. 1).

Figure 6:
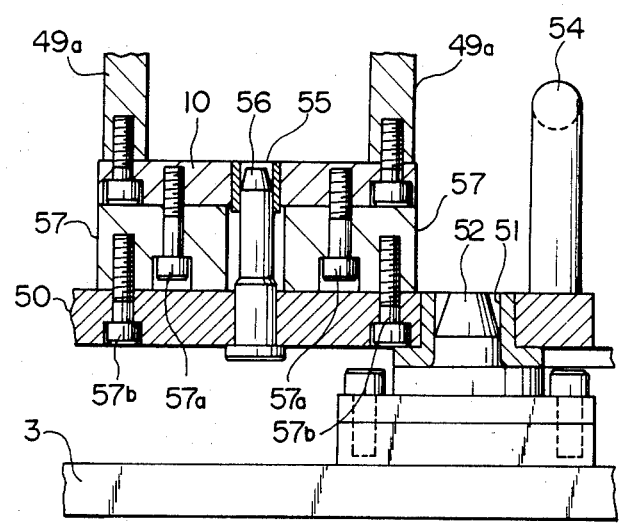
FIG. 6 is an enlarged vertical sectional view showing a support plate and a platform in an assembled condition.

The platform 50 is rectangular in plan and has positioning holes 51 formed at four corners thereof. Positioning pins 52 (FIG. 6) erected at predetermined positions on an upper face of the machine bed 3 are fitted in the positioning holes 51 of the platform 50. The platform 50 is removably mounted at central portions of opposite longitudinal edges thereof on the machine bed 3 by means of a pair of screws 53 (FIGS. 1, 2 and 6).

A pair of handles 54 are mounted at opposite longitudinal edge portions of the platform 50 for lifting the entire platform.

Figure 7:
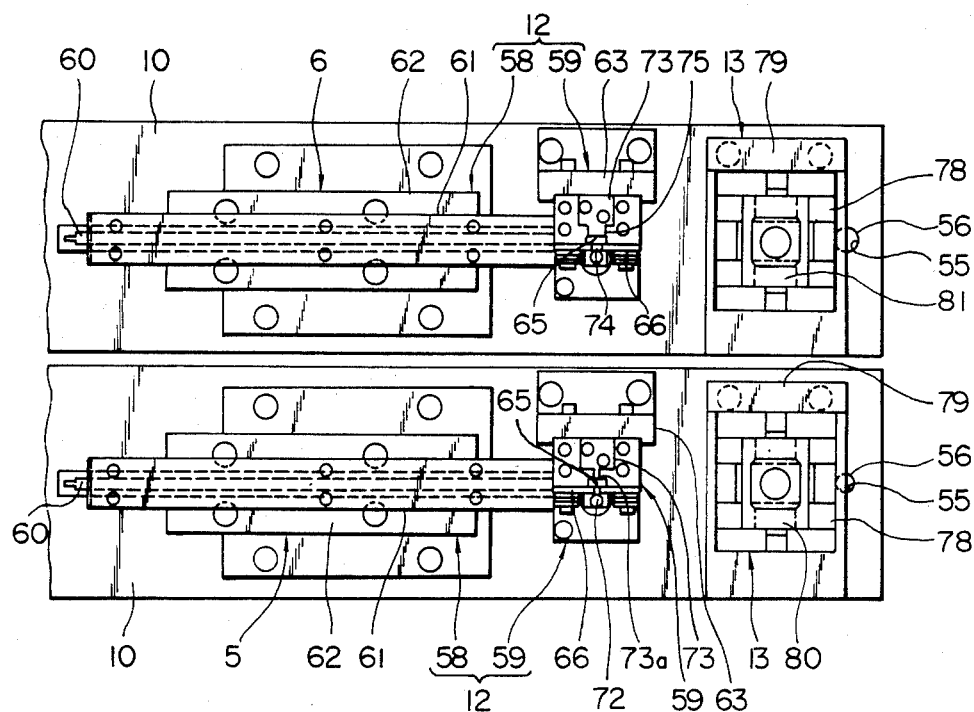
FIG. 7 is a plan view of a delivering and transporting mechanism and a hand storing mechanism.

A pair of positioning holes 55 (FIG. 6) are formed at opposite end portions of the supporting plate 10 and are fitted with positioning pins 56 erected at predetermined portions of the platform 50. Thus, the supporting plate 10 is removably mounted on the platform 50 by means of screws 57b screwed to spacers 57 which are in turn secured to opposite end portions of a lower face of the support plate 10 by means of screws 57a (FIGS. 1, 6 and 7).

Accordingly, each of the part feeding units 4 to 7 can be individually replaced by removing the supporting plate 10 thereof from the platform 50, or, alternately they can be replaced all together by removing the platform 50 from the machine bed 3.

Electronic parts 15 are supplied in a following manner by the part supply mechanism 11 having the construction as described above.

A magazine case 16 which may be full of magazines 14 is placed on a case supporting plate 30 with the bearing recesses of the bearing members 19 thereof fitted with the support rods 33 from above and with opposite end portions at a lower side thereof received on the mounting brackets 31 and 32. In the meantime, the support shafts 28 are engaged with the inclined cams 35 of the abutting pawl members 34 and push to move the abutting pawl members 34 against the tension springs 29. As a result, the abutting members 27 are displaced to their non-abutting positions (a full line position in FIG. 3) in which the opposite ends thereof are disengaged from a lowermost one of the magazines 14. Meanwhile, the support shafts 28 are engaged with the abutting shoulders 36 to thus hold the abutting members 27 to their respective non-abutting positions.

The magazines 14 released in this way move downwardly until the lowermost magazine 14 is received at a right end thereof by the supporting rod 43 and at a left end thereof by the abutting rod 38 with an opening at the right end thereof positioned in register with the opening at the right end of the guide groove 44 of the delivering guide member 17.

Meanwhile, the third magazines 14 from the bottom is positioned adjacent an opening at the lower end of the magazine case 16 and is contacted at a side face thereof by the actuator 48a of the limit switch 48.

Thus, the electronic parts 15 in the lowermost magazine 14 naturally move down one after another in the downwardly inclined guide groove 44 and are supplied one by one to the delivering transporting mechanism 12. If the magazine 14 becomes empty and the photosensors 47 thus detect that there remains no electronic part 15 at a portion of the guide groove 44 adjacent the photosensors 47, the solenoid 41 is energized. As a result, the link 40 is pivoted clockwise and the abutting rod 37 (FIG. 4) is displaced rightwardly to its abutting position in which it extends into an opening at the left end of the second lowermost magazine 14 to receive the second lowermost magazine 14 thereon while the abutting rod 38 is displaced leftwardly to its non-abutting position, thereby disengaging from the lowermost magazine 14 and allowing the lowermost empty magazine 14 to drop from the opening 46.

After the empty magazine 14 has dropped, the solenoid 41 is deenergized so that the spring 42 pivots the link 40 counterclockwise with the abutting rod 38 displaced leftwardly again to its abutting position while the abutting rod 37 is displaced to its non-abutting position to allow the formerly second lowermost magazine 14 to move down to a position in which it is supported on the abutting rod 38 at its left-end and the supporting rod 43 at its right end.

If all the magazines 14 become empty and are let drop from the opening 46 one after another to make the magazine case 16 empty, the limit switch 48 detects that the magazine case 16 is now empty since the actuator 48a of the limit switch 48 is no longer engaged with a magazine 14.

The delivering transporting mechanism 12 (FIG. 8), which receives the electronic parts 15 presented from the magazine 14 through the guide groove 44 of the guide member 17, includes a straight feeder 58 and a lift feeder 59. The straight feeder 58 includes a vibrator 62 and a chute 61 mounted on the vibrator 62 and having a feeding groove 60 formed to receive electronic parts 15 for sliding movement therein. The straight feeder 58 is located adjacent the delivering guide member 17 (FIG. 4) on the support plate 10 with a left end of the feeding groove 60 positioned in register with a right end of the guide groove 44 such that an electronic part 15 delivered from the guide groove 44 may be fed to the lift feeder 59 along the feeding groove 60 while vibrations are imparted to the chute 61 from the vibrator 62.

Figure 8:
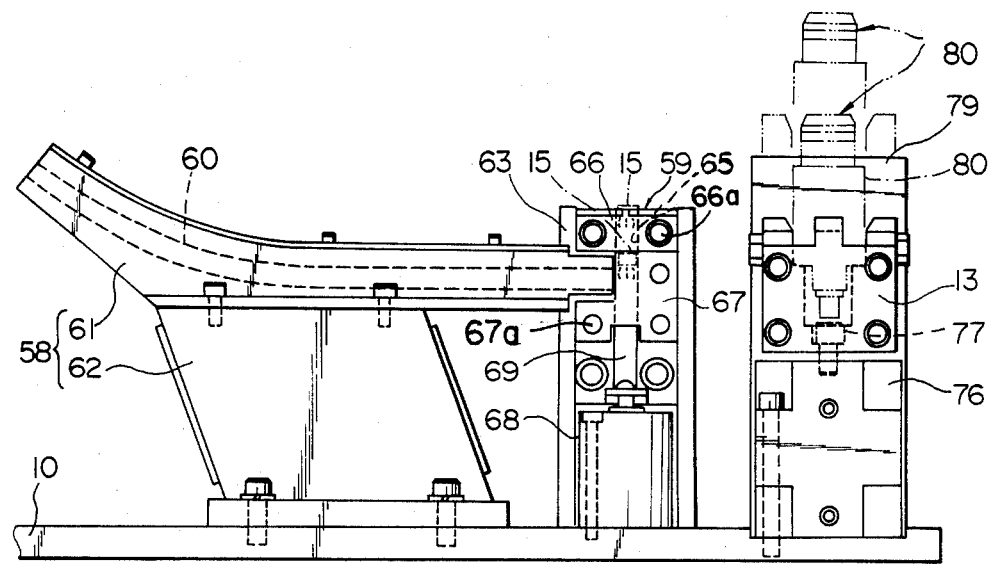
FIG. 8 is a front elevational view of the mechanisms of FIG. 7.
Figure 9:
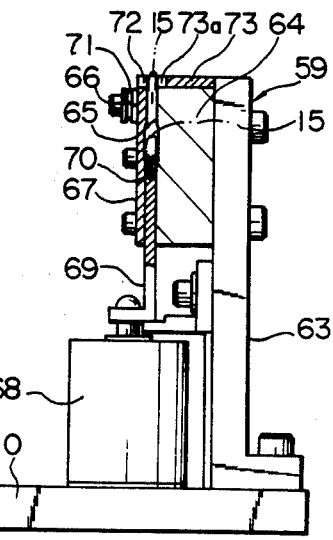
FIG. 9 is a side elevational view, partly in section, showing a lift feeder.

The lift feeder 59, one of which is associated with each straight feeder 58, is designed to lift electronic parts 15 fed thereto by the straight feeder 58 separately to a predetermined, raised position. Each lift feeder 59, as shown in FIGS. 8 and 9 includes a supporting plate 63 erected on the support plate 10 and a base member 64 screwed to the supporting plate 63 and having an open-sided vertically aligned groove (unnumbered) formed on one side face thereof. A side plate 67 is secured by threaded fasteners 67a to the base member 64 to close the groove and define a feeding slot 65. Another side Plate 66 is located above the side plate 67 and resiliently mounted to the base member 64 by threaded fasteners 66a with resilient web washers 71 (FIG. 9) urging the side plate 66 against the base member 64 to likewise close the groove and define the closed feeding slot 65.

The right end of the feeding groove 60 of the straight feeder 58 is connected to a substantially central portion of the feeding slot 65 so that electronic parts 15 may be fed laterally one by one into the feeding slot 65 from the straight feeder 58. A delivery plate 69 is fitted in the feeding slot 65 for sliding movement in a portion below the central portion of the feeding slot 65. The delivery plate 69 is connected, at its lower end, to an air cylinder 68 for up and down movement in the feeding slot 65 between a lower position, in which an electronic part 15 can be laterally fed into the feeding slot 65, and an upper or raised position, in which an electronic part 15 in the feeding slot 65 is lifted to and retained in a raised position for presentation to a mechanical hand, described more fully below.

The delivery plate 69 is in the form of an elongated plate and has a recess 70 formed at an upper end thereof for receiving terminals of an electronic part 15. As the delivery plate 69 is moved up from a stand-by position in which the top end thereof is positioned adjacent the feeding slot 60 to a delivery position by the air cylinder 68, the electronic part 15 with the terminals thereof received in the recesses 70 of the delivery plate 69 is lifted to an opening at the top end of the feeding slot 65 until an upper portion of the package is exposed upwardly from the electronic part 15 opening at the top end of the feeding slot 65 (FIGS. 7 to 9).

The side plate 66 is under the urging force by the web washer 71 so that it may be pressed against an electronic part 15 lifted by the delivery rod 69 to prevent the electronic part 15 from jumping out from the opening at the top end of the feeding slot 65 in error.

Also disposed adjacent the opening at the top end of the feeding slot 65 are a control projection 72 provided at the center of an upper edge of the side plate 66 and another control projection 73a of a plate member 73 screwed to an upper face of the base member 64. The control members 72 and 73a are thus operable to engage with central portions of opposite side faces of the package of the electronic part 15 delivered to the opening at the top end of the feeding slot 65 to prevent the electronic part 15 from falling downwardly when the delivery plate 69 is moved to its lower position.

The side-to-side and depth dimensions of the feeding slot 65 are dictated, in part, by the dimensions of the electronic part 15 package. The dimensions of the feeding slot 65 should be such to accommodate the electronic part with sufficient clearance to allow upward movement in response to the upward stroke of the delivery plate 69. Thus, the dimensions of the feeding slot 65 are basically fixed by the base member 64 and the lower and upper side plates 67 and 66, with the side plate 66 resiliently biased by the web washers 71 to the base member 64. The dimensions of the recess 70 formed at the top end of the delivery plate 69 is controlled by the dimensions of the terminals. In general, the recess 70 should have a vertical depthwise dimension sufficient to accommodate the length of the terminals and a front-to-back dimension greater than the thickness dimension of the terminals to allow the terminals to readily slide into the recess 70 when the electronic part 15 enters the feeding slot 65 from the feed groove 60 of the chute 61.

By the way, in the present embodiment, of the four part feeding units 4 to 7, each of the units 4 and 5 has its lift feeder 59 disposed such that the package of an electronic part 15 is grasped in one horizontal orientation by chuck pawls 114 which will be hereinafter described while each of the units 6 and 7 has its lift feeder 59 disposed such that the package of an electronic part 15 is grasped in a perpendicular horizontal direction by chuck pawls 115 which will be hereinafter described.

The lift feeders 59 which are disposed to let an electronic part 15 be grasped in the perpendicular horizontal direction have the same construction as the lift feeders 59 which are disposed to let an electronic part 15 be grasped in the one horizontal direction except that a control projection 74 of the side plate 66 and another control projection 75 of the former are different in shape from the corresponding projections 72 and 73a of the latter.

The hand storing mechanisms 13 (FIG. 8 and FIG. 10), which function to store detachable mechanical hands (described below) used by the inserting device 9, each have the same construction independently of whether an electronic part 15 is grasped in the one horizontal direction or in the perpendicular horizontal direction and each include an air cylinder 76 mounted on the support plate 10, a hand receiving member 78 in the form of a bottomed square tube opened at the top end thereof and mounted at the top end of a piston rod 77 of the air cylinder 76, and a guide plate 79 mounted erectly adjacent one side of the hand receiving member 78 for guiding the up and down movement of the hand receiving member 78 by the air cylinder 76 (FIGS. 7 and 8).

Figure 10:
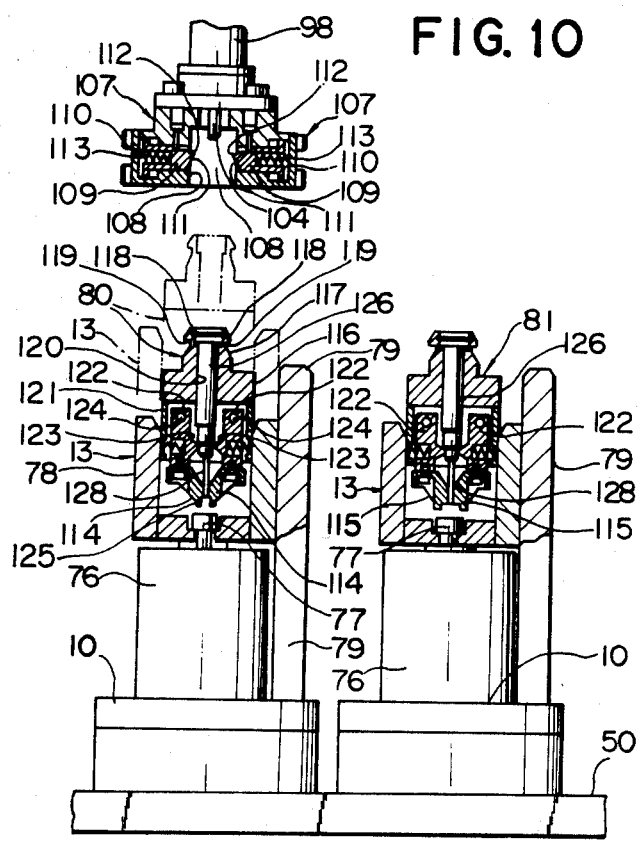
FIG. 10 is a vertical sectional view showing a hand, the hand storing mechanism of FIG. 7, and a lower portion of a hand holder hand holder.

Of the part feeding units 4 to 7, each of the units 4 and 5 has its hand receiving member 78 so arranged that it may receive therein a hand 80 of a inserting device 9, which will be described below, which hand 80 grasps an electronic part 15 in one horizontal orientation, as shown on the left in FIG. 10, while each of the units 6 and 7 has its hand receiving member 78 so arranged that it may receive therein a hand 81 which grasps an electronic part 15 in a perpendicular horizontal orientation, as shown on the right in FIG. 10.

The inserting device 9 functions to engage one of the hands 80 or 81 carried in the various hand storing mechanisms 13, grasp an electronic part 15 presented by one of the lift feeders 59, and insert the electronic part 15 in a printed circuit board, as described below. The inserting device 9 includes (FIGS. 1 and 2) a base 82 having a rectangular shape in plan and mounted on the machine bed 3, a pair of guide rods 83 mounted on and extending in a longitudinal direction of the base 82, a carrier 84 mounted for sliding movement on the guide rods 83, in a X—X' direction a screw shaft 85 disposed between and extending in parallel relationship to the guide rods 83 and held in threaded engagement with a threaded hole formed in the carrier 84, and a bidirectional motor 86 for rotating the screw shaft 85 in opposite directions to move the carrier 84 in opposite X—X' directions.

A hand carrying unit 88 is mounted vertically at an end of an arm 87 having a rectangular shape in plan while a motor 89 is mounted on the other end of the arm 87. A guide rod 90 is mounted at a lower portion of and extends in a longitudinal direction of the arm 87 and is slidably received in a bearing hole formed in the carrier 84. A screw shaft 91 is mounted at an upper portion of and extend in the longitudinal direction of the arm 87 and is held in threaded engagement with a threaded hole formed in the carrier 84 so that the screw shaft 91 which is connected to be rotated in opposite directions by the motor 89 may move the carrier 84 in Y—Y' directions. As shown in phantom and solid line illustration in FIG. 1, the hand carrying unit 88 can be moved leftward (phantom line illustration) in the Y direction to a position above the lift feeders 59 for grasping an electronic part 15 and moved rightward (solid line illustration) in the Y' direction to a position just to the right of the printed circuit board feeder 8.

The hand carrying unit 88 includes a case 92 (FIG. 11) in the form of a square tube mounted vertically at an end of the arm 87, a rotary cylinder 93 mounted at the top end of the case 92, another rotary cylinder 95 mounted in an upper portion of the case 92 and having a drive shaft 96 connected to another drive shaft 94 of the rotary cylinder 93. Thus, the drive shaft 96 can be rotated within a range of angle from 0 to 270 degrees by selective rotation of the rotary cylinders 93 and 95.

An air cylinder 97 is mounted at a lower portion of the case 92 and includes a pair of cylinder heads 97a and 97b, a power shaft 98 mounted for vertical movement in the cylinder heads 97a and 97b, and a piston 99 fitted on the power shaft 98.

The power shaft 98 is in the form of a pipe and is connected by means of a clamp 101 to a connecting rod 100 which has an upper end thereof securely fixed to the drive shaft 96 so that the power shaft 98 may rotate in integral relationship with the drive shaft 96 while it can move up and down independent of the latter.

Figure 11:
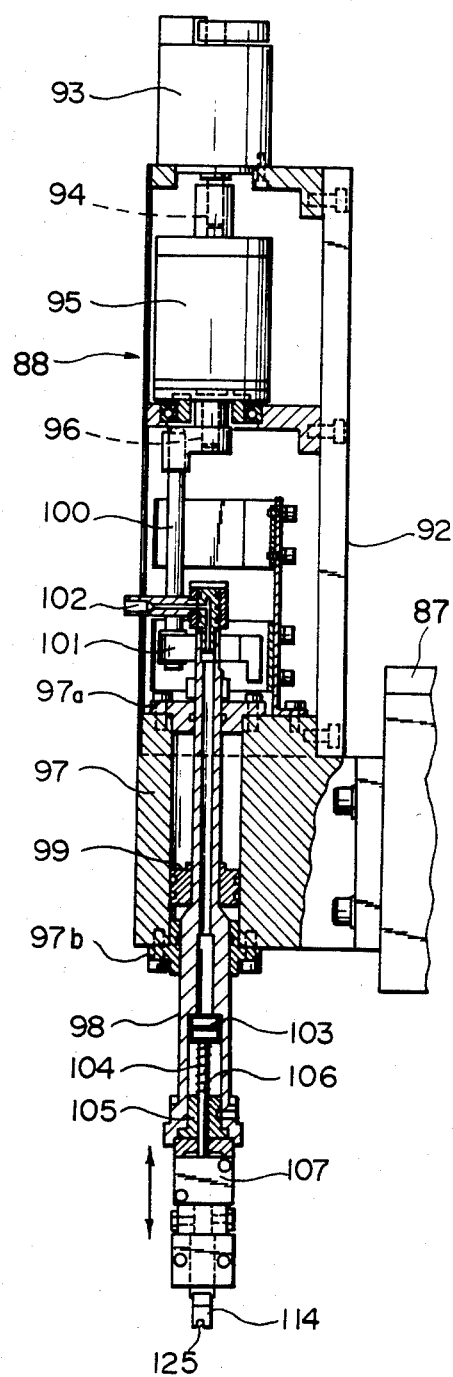
FIG. 11 is a side elevational view, partly in section, showing a hand unit and a hand.

An air nozzle 102 is pivotally connected to an upper end portion of the power shaft 98 while a piston rod 104 having a piston 103 mounted at an upper end thereof is fitted in a lower portion of the power shaft 98. The piston rod 104 is supported for axial vertical movement in a cylinder head 105 fitted in an opening at the lower end of the power shaft 98 and is urged in an upward direction by a coil spring 106. The piston rod 104 is moved down against the urging of the coil spring 106 by compressed air fed into the power shaft 98 via the air nozzle 102 (FIG. 11).

Figure 12:
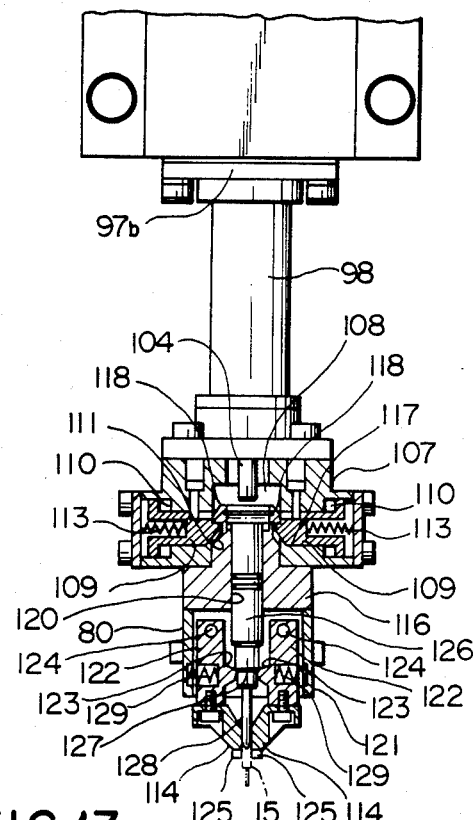
FIG. 12 is vertical sectional view illustrating a hand mounted on a hand holder.

A hand holder 107 is mounted at a lower end of the power shaft 98 and is adapted to automatically grasp or release a hand 80 or 81. The hand holder 107 has a substantially parallelepiped configuration and has a receiving hole 108 of a rectangular cross section formed at a central portion thereof and opened to upper and lower faces thereof. The hand holder 107 further has a pair of recesses 110 formed at left and right portions thereof and adapted to receive a pair of latches 109 therein. A lower portion of the piston rod 104 extends into the receiving hole 108 from above (FIGS. 10 and 12).

The recesses 110 are opened to opposing portions of the receiving hole 108 and each have an expanded interior so as to receive the latch 109 for sliding movement therein. Each of the latches 109 has a tapered cam 111 and an abutting shoulder 112 formed thereon and is urged to an abutting position (FIGS. 10 and 12) in which the abutting shoulder 112 extends into the receiving hole 108. Meanwhile, if compressed air is fed to a predetermined portion of the recesses 110, then the latches 109 are automatically displaced against the urging of the coil springs 113 to a non-abutting position in which the abutting shoulder 112 is retracted in the recess 110.

The mechanical hands 80 and 81 have the same construction with each other except that their chuck pawls 114 and 115 for grasping an electronic part 15 are different in configuration from each other. Hence, description will be given in detail only of the hand 80 which grasps an electronic part 15 in one horizontal orientation.

The hand 80 (FIGS. 10 and 12) includes a base member 116 having a rectangular shape in plan. The base member 116 has formed at the center of an upper face thereof an engaging projection 117 which is rectangular in plan and is adapted to be closely fitted in the receiving hole 108 of the hand holder 107. The base member 116 further has a pair of tapered cams 118 and a pair of engaging shoulders 119 formed on opposite sides of the engaging projection 117.

The base member 116 has a through-hole 120 of a circular cross section formed to extend therethrough and be opened at the center of the top face of the engaging projection 117 and at the center of the bottom face of the base member 116. A support bracket 121 is mounted on a lower periphery of the base member 116 and is rectangular in cross section and opened at the bottom thereof.

A pair of chuck holders 122 each in the form of a square bar each have a projection 123 of a semicircular cross section integrally formed at a central portion of an inner face thereof. Each of the chuck holders 122 is supported for pivotal motion on the support bracket 121 by means of a shaft 124, and the projections 123 are positioned in opposing relationship to each other.

The chuck pawls 114 are screwed to lower ends of the chuck holders 122 and each have formed at the center of an end thereof a recess 125 for receiving the control projection 72 or 73a that face each other across the vertical feeding slot 65 of the various lift feeders 59.

A rod 126 of a circular cross section has an annular, reversely tapered cam 127 formed at a lower portion thereof and has a kicker pin 128 mounted at a lower end thereof. An upper portion of the rod 126 is fitted for sliding movement in the through-hole 120 of the base member 116 with the top end thereof positioned adjacent and in opposing relationship to a lower end of the piston rod 104. A lower end of the kicker pin 128 slidably extends between the chuck pawls 114.

The chuck holders 122 are urged in predetermined directions to normally engage the projections 123 thereof with the cam 127 individually by means of a pair of coil springs 129.

Thus, when a smaller diameter portion of the cam 127 is engaged by the projections 123, the chuck pawls 114 are closed to grasp an electronic part 15 therebetween with the bottom end of the kicker pin 128 positioned in opposing relationship to an upper face of the package of the electronic part 15 thus grasped (FIG. 12).

In the condition in which an electronic part 15 is grasped by the chuck pawls 114, if the piston rod 104 is lowered and engaged to push the rod 126, a larger diameter portion of the cam 127 is now engaged by the projections 123 thereby to open the chuck pawls 114 against the urging of the coil springs 129, and the kicker pin 128 is lowered to engage with the top face of and push down the package of the electronic part 15.

The chuck pawls 115 of the hand 81 grasp an electronic part 15 in the perpendicular horizontal orientation, that is, they grasp at opposite longitudinal ends of an electronic part 15, and have the same construction and function with the chuck pawls 114 of the hand 80 except that portions of the chuck pawls 115 at which they grasp an electronic part 15 are rather widened and that the chuck pawls 115 have nothing provided thereon which correspond to the recesses 125 for receiving the control projections 72 and 73a.

When a hand 80 or 81 is to be mounted on a hand holder 107, for example, a hand 80 is lifted to a predetermined position (phantom in FIG. 10) by the air cylinder 76 of a hand storing mechanism 13 in which the hand 80 is stored, and then a hand holder 107 is moved to a position above it and lowered to fit the receiving hole 108 with the engaging projection 117.

As the receiving hole 108 is fitted with the engaging projection 117, the tapered cams 111 are engaged and pushed by the tapered cams 118 so that they are once displaced to their respective non-abutting positions whereafter they are automatically returned to their respective abutting positions by the urging of the coil springs 113. As a result, the abutting shoulders 112 are engaged with the engaging shoulders 119, thereby automatically mounting the hand 80 on the hand holder 107 (FIG. 12).

On the contrary, when the hand 80 is to be removed from the hand holder 107 and to be stored into the hand storing mechanism 13, the hand 80 is inserted from above into the hand storing mechanism 13 in the predetermined lifted position, and compressed air is fed to certain positions of the recesses 110 of the hand holder 107 to displace the latches 109 to their non-abutting positions to release the hand 80. Thereafter, the hand holder 107 is lifted while the hand storing mechanism 13 is lowered to release the fitting engagement of the engaging projection 117 with the receiving hole 108. As a result, the hand 80 is automatically removed from the hand holder 107 and can be automatically stored into the hand storing mechanism 13.

Further, when a hand 81 is to be automatically mounted on or removed from a hand holder 107 or when a hand 80 or 81 is to be exchanged, it is apparent that similar operations may be followed as in the case of the hand 80 described above.

As can be appreciated from the above description, the hand carrying unit 88 can be moved by appropriate operation of motors 86 and 89 to any position X,Y within the range permitted by the axes X—X' and Y—Y' and also moved up and down in the vertical direction to engage or disengage one of the hands 80,81 presented by the various hand storing mechanisms 13, use an engaged hand 80,81 to grasp an electronic part 15 presented by the various lift feeders 59, and insert the so-grasped electronic part 15 into a printed circuit board.

The circuit board feeding mechanism 8 (FIGS. 13 and 14) is provided for feeding a printed circuit board 130 on which an electronic part 15 is to be mounted. The circuit board feeding mechanism 8 includes a rectangular platform 131 located on an upper face of the machine bed 3, and two opposing pairs of supporting plates 132, 133 and 134, 135 erectly mounted on and extending along opposite longitudinal edge portions of the rectangular platform 131.

A guide rod 136 and a screw shaft 137 extend in parallel relationship between upper portions of the supporting plates 132 and 133.

The guide rod 136 has a circular cross section and is secured to the supporting plates 132 and 133 while the screw shaft 137 is supported for rotation on the supporting plates 132 and 133. A pulley 138 is mounted on an end of the screw shaft 137 which extends outwardly from the supporting plate 133 while a handle mounting means 136a is provided on an outer extension at the other end of the screw shaft 137.

Meanwhile, a guide rod 139 and a screw shaft 140 extend between upper portions of the supporting plates 134 and 135 in a similar manner to that of the guide rod 136 and the screw shaft 137.

A pulley 141 is mounted on an outer extension of the screw shaft 140 while a handle mounting means 142 is formed on the other outer extension of the screw shaft 140. A timing belt 143 extends between the pulley 141 and the pulley 138.

The guide rods 136 and 139 have cylindrical sliders 144 and 145 slidably fitted thereon, respectively, while screw nuts 146 and 147 are threadably engaged with the screw shafts 137 and 140. A support plate 148 is screwed to and extends upwardly from the slider 144 and the screw nut 146 while another support plate 149 is screwed to and extends upwardly from the slider 145 and the screw nut 147.

A pair of guide rails 150 and 151 extend in parallel relationship and at a same vertical position over the entire length of the platform 131. Each of the guide rails 150 and 151 has a rectangular cross section and has a shoulder 152 formed to extend in a longitudinal direction along an upper inner edge thereof. The guide rail 150 is secured to upper ends of the supporting plates 132 and 134 while the guide rail 151 is secured to upper ends of the support plates 148 and 149.

Figure 13:
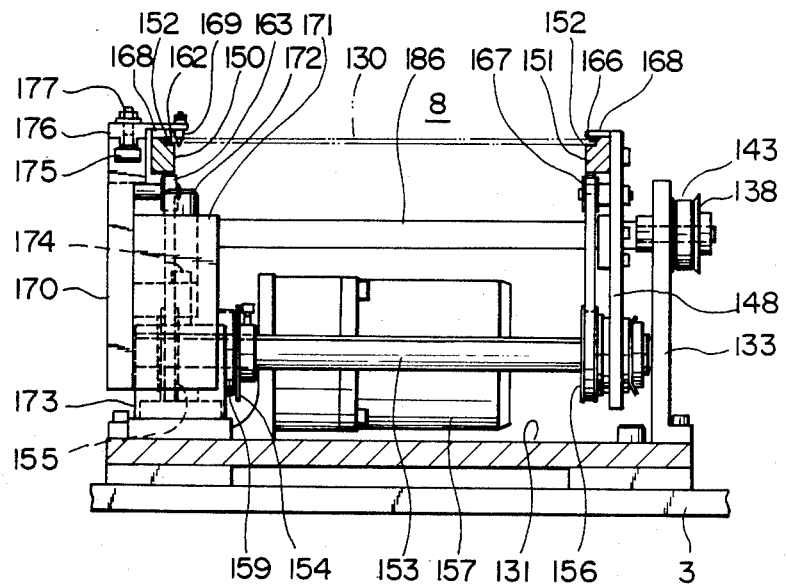
FIG. 13 is a front elevational view of a circuit board feeding mechanism.
Figure 14:
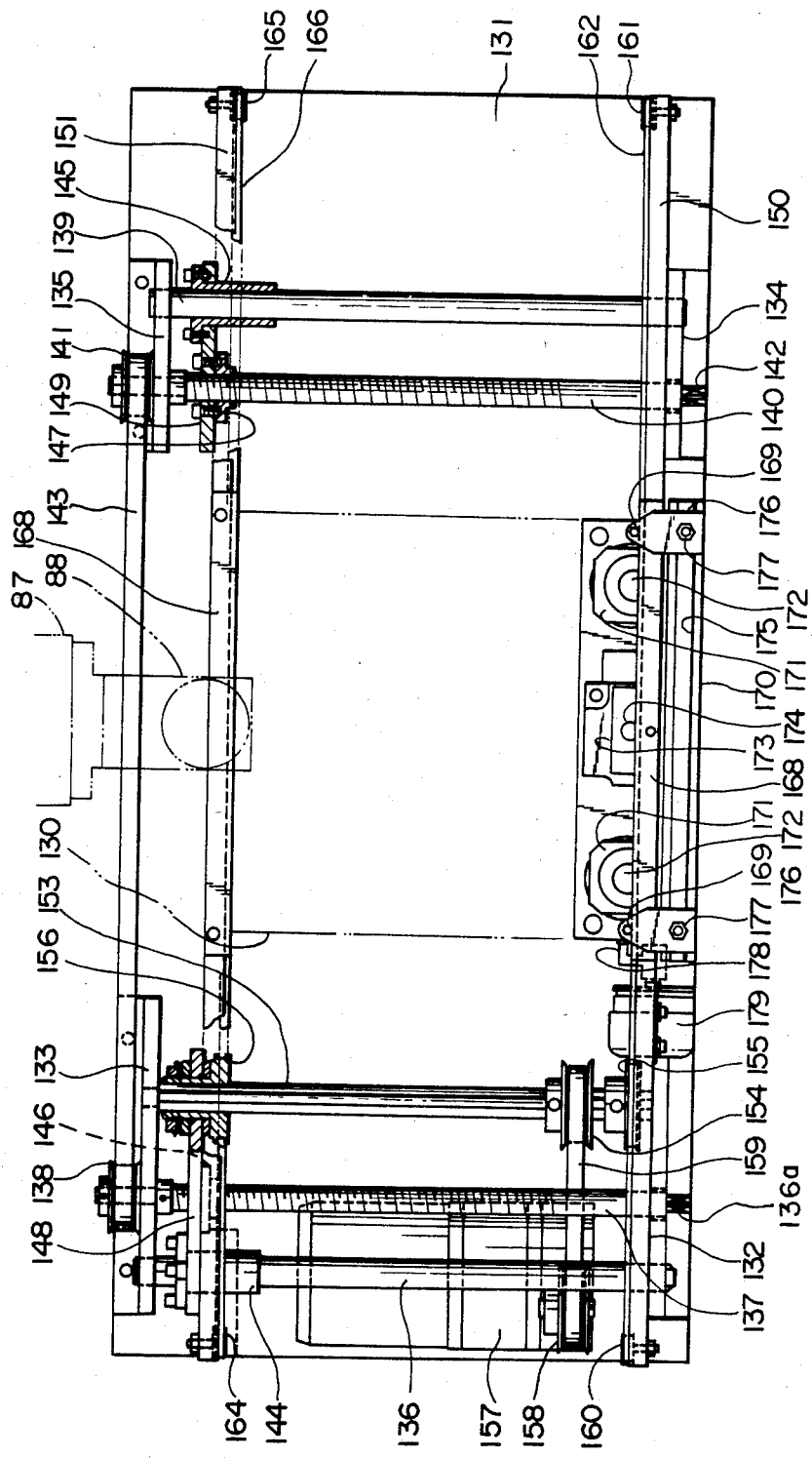
FIG. 14 is a plan view of the mechanism of FIG. 13.

A shaft 153 extends in parallel relationship to the guide rod 136 between lower portions of the supporting plates 132 and 133 and is supported at opposite ends thereof for integral rotation on the supporting plates 132 and 133. Pulleys 154 and 155 are mounted on portions adjacent an end of the shaft 153 while another pulley 156 is fitted on a portion adjacent the other end of the shaft 153 in such a manner as to allow integral rotation with and sliding axial relative motion on the shaft 153. The pulley 156 is rotatably connected to the supporting plate 148 (FIGS. 13 and 14).

A motor 157 is located on the platform 131 below the guide rod 136, and a timing belt 159 extends between the pulley 154 and another pulley 158 mounted on a rotary shaft of the motor 157.

A pair of pulleys 160 and 161 are rotatably mounted at opposite ends of the guide rail 150, and an annular belt 162 extends between the pulleys 160 and 161. An upper section of the belt 162 extends along an upper face of the shoulder 152 of the guide rail 150 while a lower section of the belt 162 extends along a lower face of the guide rail 150. The lower section of the belt 162 extends around the pulley 155 via a pair of tension pulleys 163 (only one is shown) mounted for rotation on the supporting plate 132.

Meanwhile, a pair of pulleys 164 and 165 are rotatably mounted at opposite ends of the guide rail 151, and a belt 166 extends between the pulleys 164 and 165 and is arranged in a similar manner to that of the belt 162. A lower section of the belt 166 extends around the pulley 156 via a pair of tension pulleys 167 (only one is shown) mounted for rotation on the supporting plate 148.

Accordingly, if the motor 157 is energized to rotate the shaft 158, the pulleys 155 and 156 are rotated thereby so that the upper sections of the belts 162 and 166 travel from the right to the left (FIG. 14) along the shoulders 152 of the guide rails 150 and 151, respectively, to move a printed circuit board 130 placed on opposite end edges of the belts 162 and 166 in the same direction.

A distance between the guide rails 150 and 151 can be adjusted in accordance with a size of a printed circuit board 130. In detail, if a handle (not shown) is operated to rotate the screw shaft 137 or 140 in a predetermined direction, the screw nut 146 or 147 is moved back or forth accordingly so that the guide rail 151 is moved back or forth while maintaining the parallel condition thereof with the guide rail 150, thus to a position at which the guide rails 150 and 151 are spaced a desired distance from each other.

A pair of elongated control plates 168 are screwed to central portions of upper faces of the guide rails 150 and 151 are mounted above and in opposing relationship to the shoulders 152 for preventing floating movement of a printed circuit board 130.

A pair of pins 169 for positioning a printed circuit board 130 are provided on a liftable plate 170 in such a manner as to allow adjustment of a distance therebetween.

The liftable plate 170 is rectangular and has a pair of cylindrical sliders 171 mounted at opposite ends of a side face thereof. The sliders 171 are fitted for sliding movement in a pair of guide rods 172 mounted erectly on the platform 131 below a central portion of the guide rail 150. An air cylinder 173 is located intermediately between the guide rods 172, and a piston rod 174 of the air cylinder 173 is connected to one side face of and supported for vertical movement by the liftable plate 170.

A guide groove 175 having a mountain-shaped cross section is formed in an upper side of and extends along the entire length of the liftable plate 170, and a pair of sliders 176 are fitted for sliding movement in the guide groove 175. The positioning pins 169 depend from ends of extensions of the sliders 176 such that they are located just inside the guide rail 150. Thus, a distance between the pins 169 can be adjusted by moving the sliders 176, and the sliders 176 can be fixed to selected positions by tightening a pair of screws 177 provided on the sliders 176.

A stop 178 is mounted on a drive shaft of a rotary solenoid 179 secured to a portion of the guide rail 150 just leftwardly of the liftable plate 170 (FIG. 14). The stop 178 can be moved between an operative position in which it is abutted by an end edge of a printed circuit board 130 to stop it to a predetermined position and an inoperative position in which it cannot be abutted by a printed circuit board 130.

When a printed circuit board 130 is to be fed, it is placed on the belts 162 and 166 such that opposite side edges thereof are received by portions of the belts 162 and 166 rightwardly of the control plates 168 of the guide rails 150 and 151 (FIG. 14), and the motor 157 is energized to transport the belts 162 and 166 leftwardly (FIG. 14).

When the printed circuit board 130 comes to a predetermined position at a central portion of the guide rails 150 and 151, an end edge thereof is abutted against with the stop 178 so that it is stopped by the latter. Thereupon, the belts 162 and 166 are also stopped.

After the printed circuit board 130 has been stopped in the predetermined position in this manner, the liftable plate 170 is lowered to insert the pins 169 into corresponding positioning holes formed in the printed circuit board 130 to thus fix the printed circuit board 130 to the position.

Then, when an electronic part 15 to be mounted on the printed circuit board 130 is to be grasped, for example, in a longitudinal direction, an electronic part 15 is grasped from a lift feeder 59 by a mechanical hand 81 and is moved to a position just above predetermined through-holes 130a to 130c (phantom in FIG. 15) formed in the printed circuit board 130. Then, ends of terminals of the electronic part 15 are inserted into the corresponding through-holes 130a to 130c, and in this condition, the kicker pin 128 is lowered to open the chuck pawls 115 and to simultaneously push down the electronic part 15 to a position in which a lower end of the package of the electronic part 15 is abutted with the printed circuit board 130 and the terminals of the electronic part 15 extend through the through-holes 130a to 130c. In this case, particularly the two opposite terminals are inserted such that bent portions 180a thereof are forcibly passed through the through-holes 130a and 130c and are projected downwardly below the printed circuit board 130.

As a result, due to resiliency of the terminals, the two terminals 180 are returned to their natural positions in which a distance between the bent portions 180a thereof is greater than a distance between the corresponding through-holes 130a and 130c. Accordingly, the bent portions 180a of the two terminals 180 will engage with edges of the through-holes 130a and 130c to prevent the terminals from being removed therefrom. Thus, the electronic part 15 can be mounted on the circuit board 130 without being inadvertently removed therefrom and in such a way that the need for a separate clinch anvil and terminal clinching step of the prior art is eliminated.

After required electronic parts 15 have been mounted on the printed circuit board 130 by the mechanical hand 81 and/or 80 all in a similar manner, the liftable plate 170 is lifted to remove the pins 169 from the positioning holes, and the stop 178 is displaced to its inoperative position to allow the belts 162 and 166 to travel leftwardly (FIG. 14) until the printed circuit board 130 is moved to a position on the guide rails 150 and 151 leftwardly (FIG. 14) of the control plates 168 in order to remove the printed circuit board 130 at the position.

Description will now be given of a device 2 for bending terminals of an electronic part and also of a process of bending terminals of an electronic part and loading it into a magazine. As explained more fully below, the terminal bending device 2 accepts magazines 14 of electronic parts 15 having unbent terminals, effects terminal bending, and provides the bent-terminal electronic parts 15 to another magazine 14 for use in the electronic part mounting apparatus 1. As explained more fully below, the terminal bending device 2 includes four cams mounted on a common rotatable shaft. The cams are of the radial type, that is, actuate a cam follower in the radial direction or of the axial-face type, this is, actuate a cam follower in the axial direction. The cams, as their mounting shaft rotates, effect one-by-one releasing of electronic parts 15 (having unbent terminals) from a supply magazine 14, the stopping and holding of the electronic part 15 at a predetermined position, the bending of the terminals, and release of the electronic part 15 (with bent terminals) to an output magazine 14.

Referring now to FIGS. 16 to 21, a base plate 181 is mounted obliquely on a housing 182, and motor 183 is mounted on a lower face of the base plate 181. A support shaft 185 is securely fixed at a base end thereof to a rotary shaft 184 of the motor 183 and extends in a horizontal direction for rotation by the motor 183. A first cam 186 is fitted on a base end portion of the support shaft 185, and a second cam 187 is formed in integral relationship with the support shaft 185 and is located just leftwardly (FIG. 16) of the first cam 186. A third cam 188, a fourth cam 189 and a pulley 190 are fitted on the support shaft 185 leftwardly of the second cam 187, and an engaging recess 192 for receiving a knob 191 therein is formed at an end thereof.

A guide groove 194 (FIG. 20) adapted to receive an electronic part 15, presented from a magazine 14 (phantom line illustration) containing a supply of electronic parts 15 with unbent terminals, for sliding movement therein is formed on an upper face of and extends along the entire length of a parallelepiped guide block member 193. The guide groove 194 is opposed to and located adjacent the base plate 181.

A central portion of the guide block member 193 extends across a left half (FIGS. 16 and 17) of a recess 195 formed rectangularly in plan in a surface of the base plate 181, and another recess 197 adapted to fit with a slider 196, which will be hereinafter described, is formed at a portion, leftwardly of the guide groove 194, of a central lower portion of the guide block member 193 extending over the recess 195.

A cover 198 is mounted on an upper face of an upper portion of the guide block member 193 and closes the guide groove 194 in this section.

A magazine holder 199 is located adjacent an upper end of the guide block member 193 and is adapted to receive thereon a magazine 14 (phantom line illustration) in which electronic parts 15a having terminals thereof not yet bent are stored and to feed the electronic parts 15a into the guide groove 194.

The magazine holder 199 is in the form of a parallelepiped having a substantially rectangular shape in plan, and an inserting groove 200 for receiving a magazine 14 is formed on and extends along the entire length of an upper end face of the magazine holder 199. A substantially upper half of the inserting groove 200 is closed by a cover 201. Below the cover 201, a control plate 203 is secured to lower ends of a pair of pins 202 mounted for up and down movement on the cover 201 and is urged to hold down a magazine inserted in the inserting groove 200.

An abutting member 205 is supported for pivotal motion around shaft 206 within the inserting groove 200 and is urged by a spring 207 to an abutting position (phantom in FIG. 20) in which it is abutted with an electronic part 15a at an opening at an end of a magazine 14 inserted in the inserting groove 200 to prevent the electronic part and succeeding electronic parts 15a from flowing out of the magazine 14.

The magazine holder 199 is supported for pivotal motion around a shaft 208a on a bearing bracket 208 mounted on a lower face of the base plate 181. After the magazine holder 199 is moved to its loading position (phantom in FIG. 20), a magazine 14 is inserted at an end portion thereof obliquely from below into the inserting groove 200 until the opening portion thereof is abutted with the abutting member 205, whereafter the magazine holder 199 is set to a feeding position (a full line position in FIG. 20). When the magazine holder 199 is thus set, the abutting member 205 is engaged with a stud 198a screwed in the cover 198 and is pivoted thereby against the urging of the spring 207 to thus release the electronic parts 15a. As a result, the electronic parts 15a naturally flow down into the guide groove 194. A pair of positioning perforations 199a and 199b are formed in a side wall of the magazine holder 199.

Figure 17:
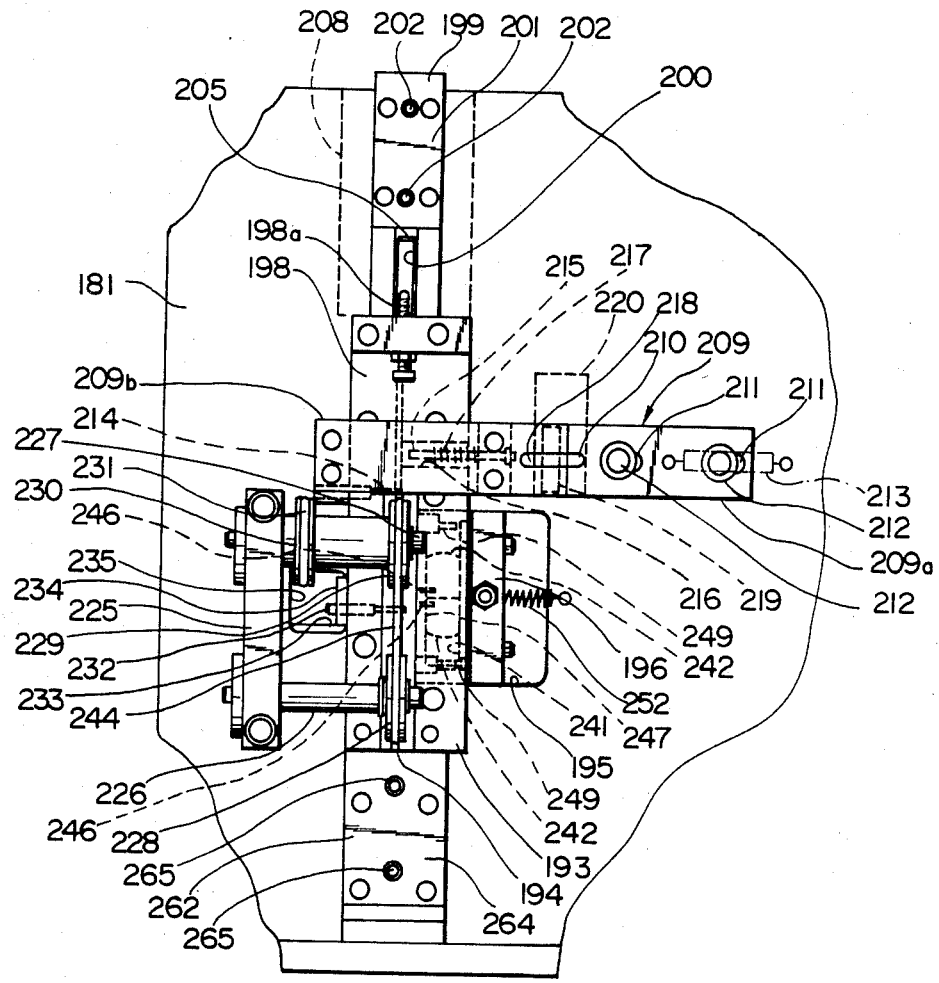
FIG. 17 is a plan view of essential part of the device of FIG. 16.
Figure 18:
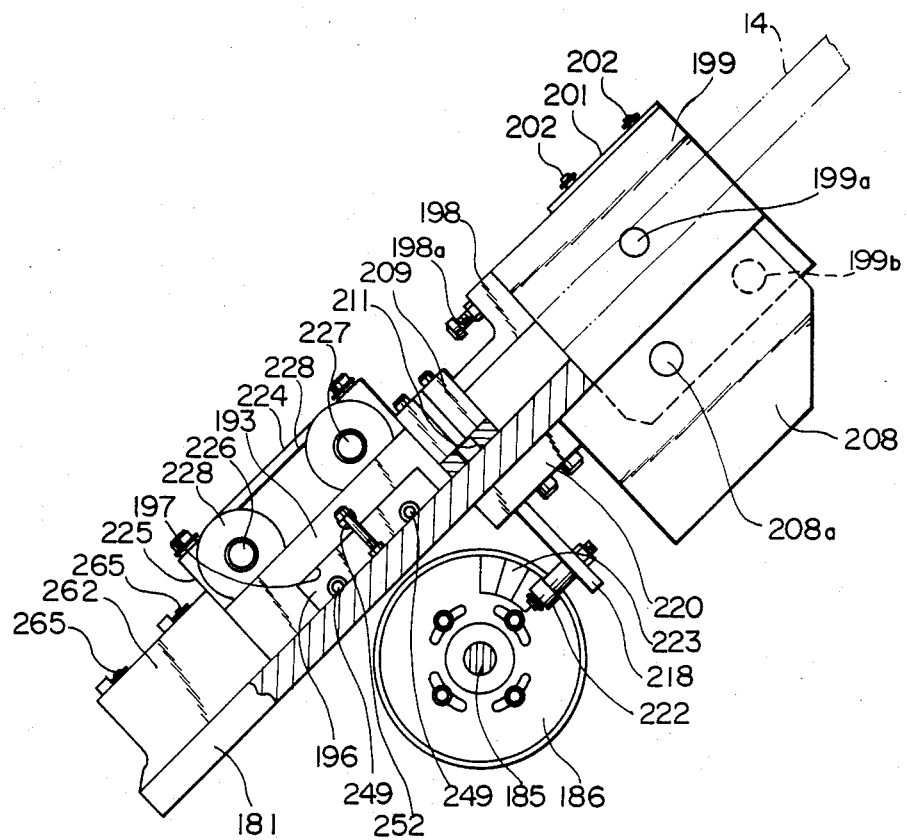
FIG. 18 is a vertical sectional view taken along line 18—18 of FIG. 16.

A controlling arm 209 in the form of an elongated plate is bent at a central portion thereof like a crank with a left portion 209b located higher than a right portion 209a thereof (FIG. 17). An elongated bearing hole 210 is formed at a central portion of the controlling arm 209 while a pair of elongated holes 211 are formed in the right portion of the controlling arm 209.

Figure 16:
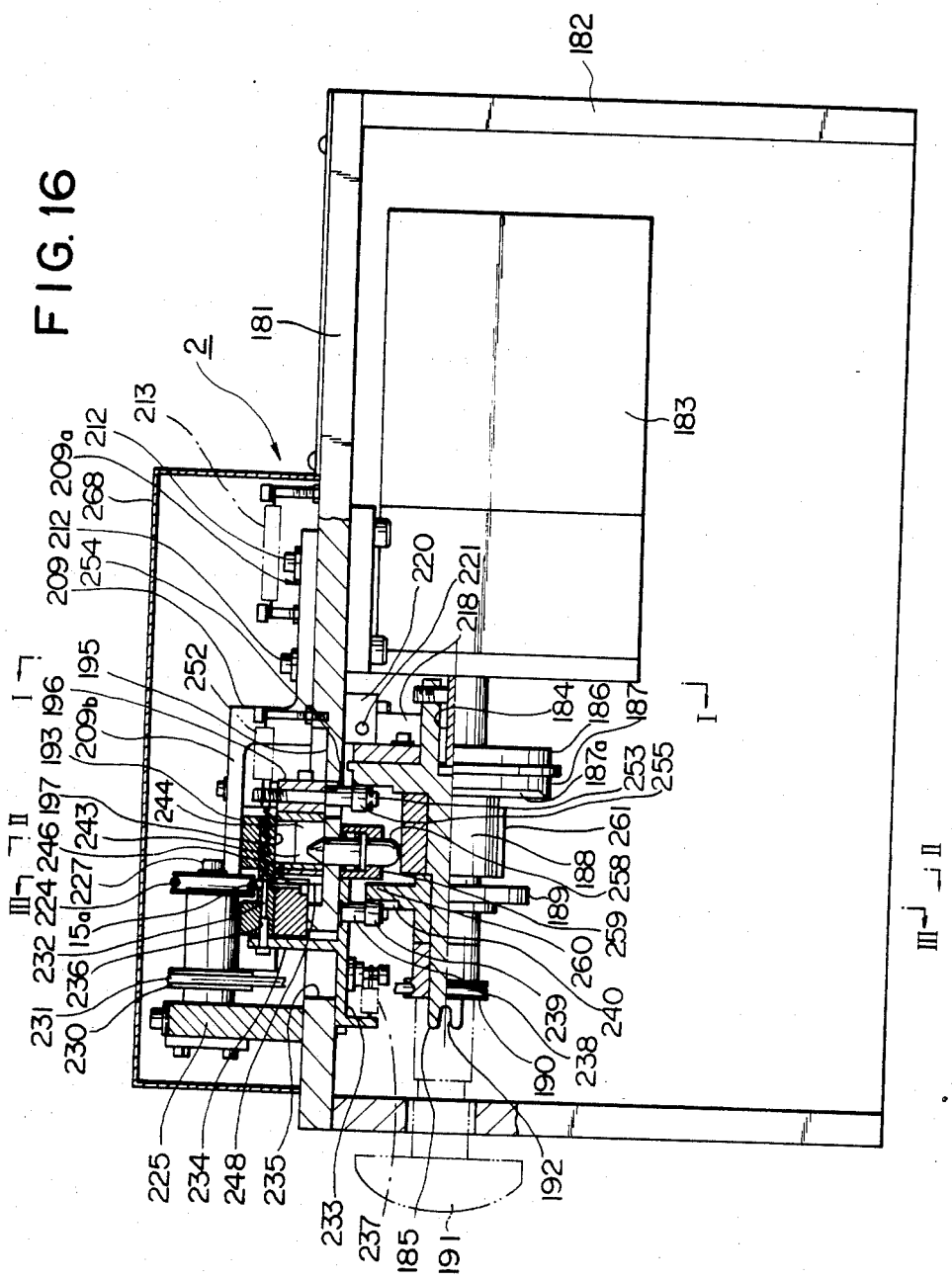
FIG. 16 is a vertical sectional view, partly in section, showing a device for bending terminals of an electronic part.

The controlling arm 209 has its right-hand side portion contacted with a surface of the base plate 181 and has its left-hand side portion disposed to extend above and across the cover 198. A pair of pins 212 (FIG. 10) mounted on the base plate 181 extend upwardly through a pair of elongated holes 211 formed in the controlling arm 209 so as to mount the controlling arm 209 for sliding movement in leftward and rightward directions (FIGS. 16 and 17). The controlling arm 209 is urged to a stand-by position (FIGS. 16 and 17).

A controlling pin 214 is mounted horizontally below the left-hand side portion 209b of the controlling arm 209. The controlling pin 214 is inserted in a horizontal hole formed in a left-hand side portion of the guide block member 193 and has an end thereof projected into the guide groove 194.

When the controlling arm 209 is in the stand-by position, the controlling pin 214 is engaged to stop an electronic part 15a within the guide groove 194.

Another controlling pin 215 is mounted horizontally for leftward and rightward movement below the left-hand side portion 209b of the controlling arm 209 and is inserted in a horizontal hole 216 formed in the right-hand side portion of the guide block member 193. When the controlling arm 209 is in the stand-by position, the controlling pin 215 is in its stand-by position in which it is positioned a little inside of a side face of the guide groove 194. The controlling arm 209 is urged to the stand-by position by a spring 217.

A lever 218 for operating the controlling arm 209 is supported at an upper end thereof for pivotal motion around a shaft 219 which extends horizontally within a bearing hole 210. The lever 218 is further supported at a central portion thereof for pivotal motion around a shaft 221 on a bearing member 220 which is mounted on a lower face of the base plate 181. A cam follower 222 is mounted at a lower end portion of the lever 218 and is engaged with the first cam 186.

The first cam 186 functions to effect one-by-one release of the electronic parts 15 and is in the form of a disk and has a face cam 223 of a trapezoidal cross section formed on a radial line on a side face thereof. Thus, if the first cam 186 is rotated in a predetermined direction (clockwise in FIG. 18) by the motor 183 to engage the face cam 223 with the cam follower 222, the lever 218 is pivoted to move the controlling arm 209 leftwardly (FIGS. 16 and 17) against the tension spring 213.

As the controlling arm 209 is moved leftwardly, an end of the controlling pin 215 (FIG. 17) in the stand-by position is moved leftward to engage a side face of and stops the package of an electronic part 15a positioned adjacent to and upstream of the electronic part 15a which is then in engagement with the controlling pin 214. As the first cam 180 continues to rotate, the end of the controlling pin 214 is retracted in the associated horizontal hole to release the lowermost electronic part 15a so only one electronic part 15a is allowed to move downwardly in the guide groove 194. Thus, the pins 214 and 217, respectively and under the control of the first cam 186, release the lowermost electronic part 15 for movement in the guide groove 194 while momentarily holding the next adjacent electronic part 15.

A feed belt 224 is provided for feeding an electronic part 15a which has been released from the controlling pin 214 and has moved thereto to the lower end of the guide groove 194. The feed belt 224 extends between a pair of pulleys 228 and 229 supported for rotation on end portions of support shafts 226 and 227 which are mounted horizontally on a support plate 225 mounted uprightly on the base plate 181. A lower section of the feed belt 224 extends from a portion of the guide groove 194 below the controlling arm 209 to the lower end of the guide groove 194.

A pulley 230 is supported for integral rotation with the pulley 229 on a base end portion of the support shaft 227, and a belt 231 extends between the pulley 230 and the aforementioned pulley 190. Thus, rotation of the support shaft 185 by the motor 183 rotates the attached pulley 190 so that the belt 224 is circulated thereby to positively feed an electronic part 15a along the guide groove 194 (FIG. 20) while preventing the same from moving in an uncontrolled manner.

A stopper pin 232, under the control of the cam 189 is provided for stopping an electronic part 15a fed by the feed belt 224 at a predetermined position. The stopper pin 232 is located on a supporting plate 233 mounted on a lower face of the base plate 181 for rightward movement (FIG. 17) to a position in which the stopper 232 enters the guide groove 194 to block the movement of the electronic part 15 (as shown in FIG. 21) and for leftward movement to unblock the guide groove 194 and allow movement of the electronic part the guide groove 194.

In particular, a supporting member 234 mounted uprightly on the supporting plate 233 extends upwardly from an opening 235 formed in the base plate 181, and the stopper pin 232 is mounted horizontally at the top end of the supporting member 234. The stopper pin 232 is inserted for sliding movement in a horizontal hole 236 formed at a portion of the guide block member 193 opposing to the slider 196 and is urged by a tension spring 237 to an abutting position (FIG. 16) in which an end portion thereof extends into the guide groove 194 so as to engage with and stop an electronic part 15a as shown in FIG. 21.

A cam follower 239 is supported for rotation on a support shaft 238 depending from the supporting plate 233 and is contacted with one side of the fourth cam 189.

The fourth cam 189 is in the form of a disk and has a face cam 240 of a trapezoidal cross section formed on a radial line on a side face thereof. If the fourth cam 189 is rotated in a predetermined direction by the motor 183 to engage the face cam 240 thereof with the cam follower 239, the supporting plate 233 is moved leftwardly (FIG. 16) against the tension spring 237. As a result, the end of the stopper pin 232 is retracted into the horizontal hole 236 to release an electronic part 15a.

The aforementioned slider 196 is in the form of a parallelepiped which is elongated in plan. The slider 196 is fitted for leftward and rightward movement (FIGS. 16 and 17) in the recess 195 of the base plate 181, and a substantially left-hand side half thereof is fitted in the recess 197 of the guide block member 193. A receiving section 241 of an elongated rectangle in plan is formed to open to upper and lower faces of the substantially left-hand side half of the slider 196.

A pair of operating elements 242 and 243 which are controlled by the third cam 188 to effect terminal bending (as described below), are located in the receiving section 241 and mounted for individual sliding movement toward and away from each other in parallel relationship with an axis of the guide groove 194. The operating elements 242 and 243 have a pair of left and right symmetrical reversely tapered cam faces 244 formed lower half portions of opposing side faces thereof.

The operating elements 242 and 243 are urged toward each other by a pair of compression springs 245 to stand-by position (FIG. 19) in which upper half portions of the opposing side faces thereof are contacted with each other at the center of the receiving section 241.

A pair of bending pins 246 for bending terminals of an electronic part 15a are mounted on and extend horizontally from side faces of the operating elements 242 and 243 adjacent the guide groove 194. The bending pins 246 extend outwardly through an elongated hole 247 formed in a side wall of the slider 196.

A presser plate 248, which is controlled by the second cam 187a to hold the electronic part 15a in the guide groove 194 during terminal bending, has the same elongated rectangular configuration with a side face of the slider 196. A pair of pins 249 are mounted at opposite lower corner portions of the presser plate 248 and are fitted for sliding movement in horizontal holes formed in the slider 196. A pair of coil springs (not shown) serving as a spacer are fitted around the pins 249. The presser plate 248 is supported such that a side face thereof is disposed in parallel, opposing relationship to a side face of the slider 196 with a little gap left therebetween while the other side face thereof is exposed to the guide groove 194.

Figure 20:
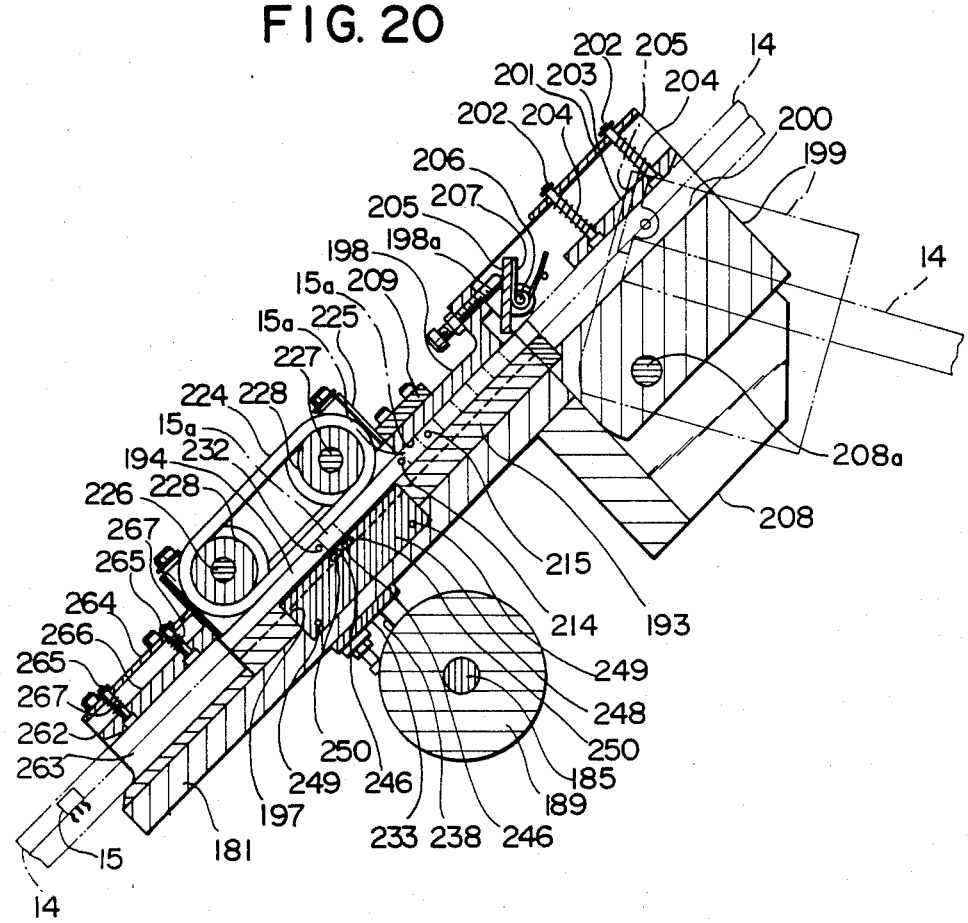
FIG. 20 is a similar view taken along line 20—20 of FIG. 16.

A pair of small elongated holes 250 are formed at an upper central portion of the presser plate 248, and a pair of forming recesses 251 (FIG. 21) for angularly bending terminals of an electronic part are formed at portions, on opposite outer sides of the elongated holes 250, of the side wall of the presser plate 248 exposed to the guide groove 194. End portions of the bending pins 246 extend into the elongated holes 250 (FIGS. 16, 20 and 21).

The slider 196 is urged by a tension spring 252 to a stand-by position (FIG. 16) in which the presser plate 248 is opposed to the guide groove 194. A support shaft 253 is mounted on a lower side of the slider 196 and extends downwardly through an opening 254 formed in the base plate 181. A cam follower 255 is supported for rotation at a lower end of the support shaft 253 and is engaged with a side face of the second cam 187 (FIG. 16).

The second cam 187 is in the form of a disk and has a face cam 187a of a trapezoidal cross section formed on a radial line on a side face thereof. If the second cam 187 is rotated in the predetermined direction to engage the face cam 187a thereof with the cam follower 255, the slider 196 is moved leftwardly (FIG. 16) against the tension spring 252. As the slider 196 is thus moved, the presser plate 248 is admitted into the guide groove 194 to abut against the guide block member 193 to press terminals of an electronic part 15a stopped by the stopper pin 232 against the guide block 193 while opposite ones of the terminals 256 are put to the forming recesses 251 (FIG. 21).

As the slider 196 is further moved leftwardly until it is closely contacted with the presser plate 248, end portions of the bending pins 246 are now positioned between the central terminal 257 and the opposite side terminals 256 (FIG. 21).

A cam follower 258, which is controlled by the third cam 188 to effect terminal bending, is formed as a round bar and is provided for operating the operating elements 242 and 243, and has a conical upper end and a semi-spherical lower end.

Figure 19:
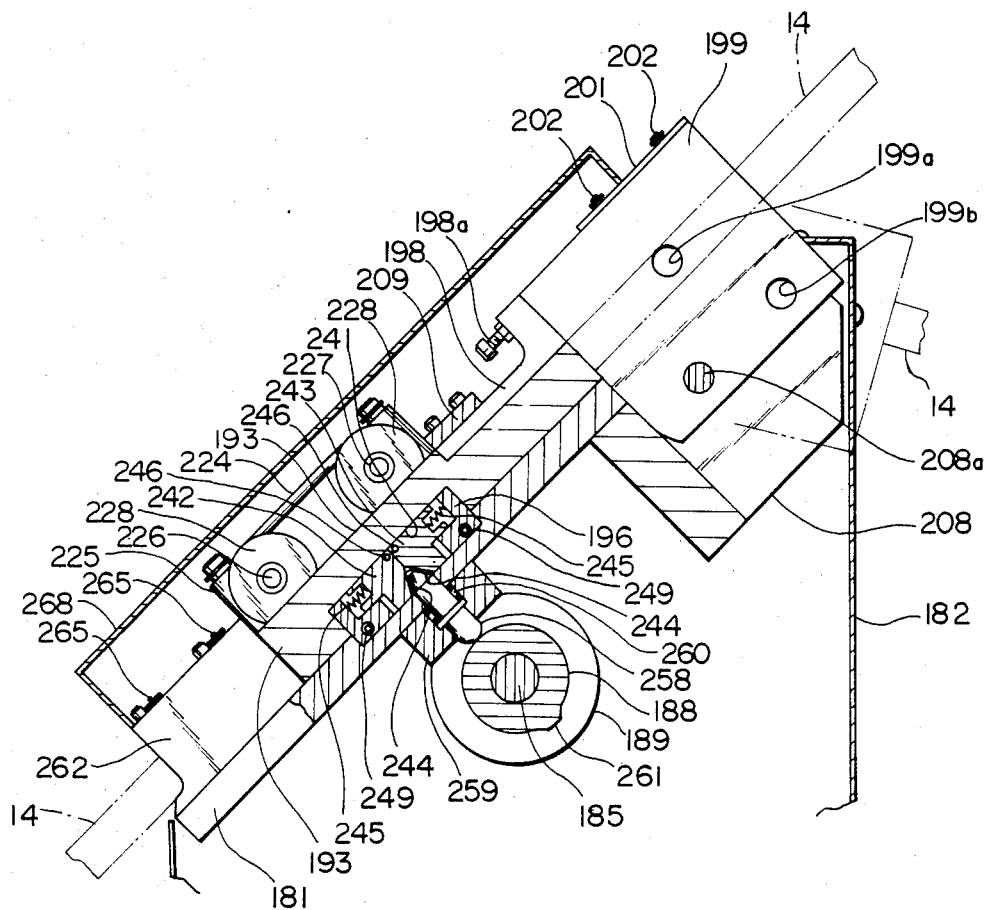
FIG. 19 is a similar view taken along line 19—19 of FIG. 16.

The cam follower 258 is supported for up and down movement on a support bracket 259 mounted on a lower face of the base plate 181 and has a lower end thereof engaged by the third cam 188 so that it is held against the urging of a compression spring 260 to a position in which an upper end of the cam follower 258 extends upwardly from a through-hole formed in the base plate 181 and is fitted in a spacing of a triangular shape in side elevation which is formed by the cam faces 244 of the operating elements 242 and 243 in their stand-by positions (FIGS. 16 and 19).

The third cam 188 is in the form of a cylinder and has a cam lobe 261 of a trapezoidal cross section formed to extend in an axial direction on a peripheral face thereof. If the third cam 188 is rotated in the predetermined direction by the motor 183 to engage the cam lobe 261 thereof with a lower end of the cam follower 258, the cam follower 258 is moved up against the compression spring 260 so that the upper end thereof is engaged in a wedge-like manner with the cam faces 244 of the operating elements 242 and 243 which have been moved leftwardly (FIG. 16) by the second cam 187 to move the operating elements 242 and 243 away from each other against the compression springs 245.

As the operating elements 242 and 243 are moved away from each other as described just above, the bending pins 246 are moved toward the forming recesses 251 to engage with and push substantially central portions of the terminals 256 into the forming recesses 251 to angularly bend them (phantom in FIG. 21).

After the slider 196 is then returned to its stand-by position to release the bending pins 246 from the terminals 256, the stopper pin 232 releases the electronic part 15a so that the electronic part 15a is fed to a magazine 14 mounted on a magazine holder 262 by the feeding belt 224.

The magazine holder 262 is in the form of a parallelepiped having an elongated rectangular shape in plan and has an insertion groove 263 formed to extend along the entire length on an upper end face thereof for receiving a magazine 14 therein. A cover 264 covers over the insertion groove 263 of the magazine holder 262.

A restraining member 266 is mounted for up and down movement below the cover 264 by means of a pair of pins 265 and is urged by a pair of compression springs 267 so as to press against a magazine 14 inserted in the insertion groove 263.

A cover 268 is mounted on the base plate 181 and covers over a section between the magazine holders 199 and 262.

The magazine holder 262 is mounted on an upper face of the base plate 181 adjacent a lower end of the guide block member 193 with an opening at an upper end of the insertion hole 263 thereof disposed in register with an opening at a lower end of the guide groove 194.

If a magazine 14 is mounted in a position in which an upper end of the magazine 14 having a packing fitted in an opening at a lower end thereof is inserted in the insertion groove 263 of the magazine holder 262 with the opening at the upper end thereof disposed in register with the opening at the lower end of the guide groove 194, an electronic part 15a which has its terminals 256 bent slides down from the guide groove 194. Thus, electronic parts 15a are admitted one after another into the magazine 14 until the latter is filled with the former (FIG. 20).

It is to be noted that while description is given above of the embodiment wherein two terminals of an electronic part are bent into a predetermined angle such that a distance between bend portions of the terminals is greater than a distance between through-holes in which the terminals are to be inserted so as to prevent the terminals of the electronic part from being removed from the insertion holes, this is an optimum example for an electronic part which has three terminals arranged in a serial row, and the present invention is not limited to such an example.

In particular, an optimum bent angle for terminals may be determined taking a quantity and arrangement of terminals, a size of through-holes and so on into consideration. For example, when an electronic part which has up to 6 terminals arranged along a circle is to be mounted in such a manner as to hold an uprightly erected condition, a bend angle for each terminal may be selected such that when the terminals with every other terminal bent are inserted in through-holes, bent points of the three terminals are located outside a triangle defined by the three through-holes in which the bent terminals are inserted.

As apparent from the foregoing description, according to the present invention, terminals of an electronic part having terminals bent in the manner described are inserted into through-holes of a circuit board to mount the electronic part on the circuit board with such bent portions of the terminals projected downwardly from the circuit board. Accordingly, a step in a conventional apparatus or process to bend lower portions of terminals inserted in through-holes with a crunch claw can be omitted. As a result, the speed of operations of mounting electronic parts can be raised. Moreover, since components or means such as an anvil head, a crunch claw and so on can be omitted, the cost of an automatic electronic part mounting apparatus can be reduced.

What is claimed is:

1. A method of mounting an electronic part comprising the steps of bending in at least two terminals of an electronic part to a required angle sufficient to prevent said terminals from being removed from through-holes of a circuit board on which said electronic part is to be mounted, storing said electronic parts having at least two terminals thereof bent in a parts-feeding magazine, feeding said electronic parts one by one from the magazine to a location to which a circuit board is fed, grasping the electronic part thus fed by a mechanical hand, and moving said mechanical hand to insert said terminals of said electronic part into through-holes of said circuit board from above until said bent portions of said terminals extend below said circuit board.

2. Apparatus for mounting an electronic part, said apparatus being of the type wherein a plurality of mechanical hands provided for grasping different types of electronic parts of different configurations are selectively changed to mount a desired electronic part on a circuit board, said apparatus comprising a power shaft mounted for movement in an axial vertical direction and in a horizontal lateral direction and for rotation, a hand holder mounted on said power shaft and adapted to removably hold a selected one of the plurality of mechanical hands, and a plurality of hand receiving mechanisms for fittedly receiving said mechanical hands therein, said hand receiving mechanisms being disposed outside a location to which a circuit board is fed.

3. Apparatus for mounting an electronic part, said apparatus being of the type wherein a plurality of mechanical hands provided for grasping different types of electronic parts of different configurations are selectively changed to mount a desired electronic part on a circuit board, said apparatus comprising a power shaft mounted for movement in an axial vertical direction and in a horizontal lateral direction and for rotation, a hand holder mounted on said power shaft and adapted to removably engage a selected one of the plurality of mechanical hands, a plurality of part supply mechanisms in which said different types of electronic parts are stored in corresponding magazines, a plurality of delivering and transporting mechanisms each provided for receiving an electronic part supplied from a corresponding one of said part supply mechanisms and for feeding the same in a predetermined direction to a predetermined position for presentation to said selected mechanical hand, said delivering and transporting mechanisms being disposed outside a location to which a circuit board is fed, and a plurality of hand receiving mechanisms for fittedly receiving respective mechanical hands therein, said hand receiving mechanisms being disposed adjacent said delivering and transporting mechanism between said location to which a circuit board is fed and said delivering and transporting mechanisms;

said power shaft movable in the horizontal lateral direction to a position above a selected hand receiving mechanism and movable in the vertical direction to cause the hand holder thereof to engage the mechanical hand in the selected hand receiving mechanism, and movable to the predetermined position for grasping the electronic part presented thereat by the delivering and transporting mechanism, and movable in the horizontal lateral direction to a predetermined position above a circuit board and in the vertical direction to mount the grasped electronic part thereon.

4. Apparatus for mounting an electronic part as claimed in claim 2 or 3, wherein each of said hand storing mechanisms inlcudes a hand receiving member in the form of a bottomed cylinder which is open at an upper end thereof for fittedly receiving a hand therein from said opening at the upper end thereof.

5. Aparatus for mounting an electronic part, said apparatus being of the type wherein a plurality of mechanical hands provided for grasping different types of electronic parts of different configurations are selectively changed to mount a desired electronic part on a circuit board, said apparatus comprising a power shaft mounted for movement in an axial vertical direction and in a horizontal lateral direction and for rotation, a hand holder mounted on said power shaft and adapted to removably engage a selected one of the plurality of mechanical hands, a plurality of part supply mechanisms in which said different types of electronic parts are stored in corresponding magazines, a plurality of delivering and transporting mechanisms each provided for receiving an electronic part supplied from a corresponding one of said part supply mechanisms and for feeding the same in a predetermined direction to a predetermined position for presentation to said selected mechanical hand, a plurality of part feeding units having one of said part supply mechanisms and one of said delivering and transporting mechanisms disposed in serial relationship thereon, and a machine bed on which said part feeding units are individually removably mounted thereon;

said power shaft movable in the horizontal lateral direction to a position above a selected hand receiving mechanism and movable in the vertical direction to cause the hand holder thereof to engage the mechanical hand in the selected hand receiving mechanism, and movable to the predetermined position for grasping the electronic part presented thereat by the delivering and transporting mechanism, and movable in the horizontal lateral direction to a predetermined position above a circuit board and in the vertical direction to mount the grasped electronic part thereon.

6. Apparatus for mounting a electronic part as claimed in claim 5, wherein said part feeding units are individually removably mounted on a platform which is in turn removably mounted on said machine bed.

7. Apparatus for mounting an electronic part, said apparatus being of the type wherein a plurality of mechanical hands provided for grasping different types of electronic parts of different configurations are selectively changed to mount a desired electronic part on a circuit board, said apparatus comprising a power shaft mounted for movement in an axial vertical direction and in a horizontal lateral direction and for rotation, a hand holder mounted on said power shaft and having a receiving hole formed to open downwardly therein, and a pair of latches disposed in opposing relationship within said receiving hole of said hand holder for displacement between an abutting position in which said latches are projected at ends thereof into said receiving hole and a non-abutting position in which the ends of said latches are retracted in said receiving hole, said latches being urged to said abutting position by the urging of a pair of respective springs, said latches being moved to said non-abutting position against the urging of said springs by air fed into said receiving hole.

8. Apparatus for mounting an electronic part as claimed in claim 7, wherein each of said plurality of mechanical hands to be removably mounted on said hand holder has an engaging projection formed therein to closely fit in said receiving hole and has a pair of abutting shoulders formed at opposing positions on opposite sides of said engaging projection for engaging with the ends of said latches in said abutting position to hold the mechanical hand on said hand holder.

9. Apparatus for bending a terminal of an electronic part, comprising a first cam for selectively allowing an electronic part to be moved to a predetermined position at which a terminal of the electronic part is to be bent, a second cam for stopping the electronic part to said predetermined position, a third cam for holding a terminal of the electronic part which is stopped at said predetermined position, a fourth cam for bending the terminal of said electronic part which is stopped at said predetermined position, and a single motor for driving said first, second, third and fourth cams.

10. Apparatus for bending a terminal of an electronic part as claimed in claim 9, wherein said first, second, third and fourth cams are mounted on a support shaft which is horizontally mounted on a machine bed and is connected to be driven by a motor.

11. An apparatus for mounting electronic parts onto a printed circuit board, said apparatus comprising:
  means for holding a printed circuit board at a predetermined position, said printed circuit board having holes therein for accepting the terminals of electronic parts;
  a plurality of hand units for releasably grasping electronic parts;
  a hand storage unit for storing each of said hand units;
  a hand carrying unit movable on two axes in a common plane, along a third axis perpendicular to the common plane, and rotatable about said third axis, said hand carrying unit having interconnection means for selectively engaging and disengaging a selected one of said hand units stored in said hand storage units and for causing the selected hand unit to grasp or release an electronic part and;
  electronic part storage and presenting means for storing a plurality of electronic parts having bent terminals and for presenting the electronic parts one-by-one to a part-presentation position;
  said hand carrying unit movable to a selected hand storage unit to engage a selected hand unit, movable to the part-presentation position to cause the selected hand unit to grasp the presented part, and movable to a position over the printed circuit board to insert the bent terminals of the electronic part through the holes in said printed circuit board until the bent portions of the terminals pass through the terminal accepting holes.

* * * * *